United States Patent [19]

Nakamura et al.

[11] Patent Number: 5,783,491
[45] Date of Patent: Jul. 21, 1998

[54] METHOD OF FORMING A TRUCK MOS GATE OR A POWER SEMICONDUCTOR DEVICE

[75] Inventors: Katsumi Nakamura; Tadaharu Minato, both of Itami; Shuuichi Tominaga, Fukuoka; Katsuomi Shiozawa, Amagasaki, all of Japan

[73] Assignee: Mitsubishi Denki Kabushiki Kaisha, Tokyo, Japan

[21] Appl. No.: 382,581

[22] Filed: Feb. 2, 1995

[30] Foreign Application Priority Data

Feb. 4, 1994 [JP] Japan ................................. 6-012559
Jan. 9, 1995 [JP] Japan ................................. 7-001347

[51] Int. Cl.$^6$ .......................... H01L 21/20; H01L 21/76; H01L 21/311
[52] U.S. Cl. .......................... 438/702; 438/386; 438/404
[58] Field of Search .......................... 437/203, 67, 90, 437/947, 927, 21, 78; 438/404, 386, 700, 702

[56] References Cited

U.S. PATENT DOCUMENTS

| | | | |
|---|---|---|---|
| 4,472,240 | 9/1984 | Kameyama | 437/78 |
| 4,735,824 | 4/1988 | Yamabe et al. | 427/79 |
| 4,839,306 | 6/1989 | Wakamatsu | 437/67 |
| 4,855,017 | 8/1989 | Douglas | 156/648.1 |
| 4,857,477 | 8/1989 | Kanamori | 437/60 |
| 5,011,788 | 4/1991 | Kawaji et al. | 437/78 |
| 5,100,822 | 3/1992 | Mitani | 437/60 |
| 5,183,775 | 2/1993 | Levy | 437/60 |
| 5,258,332 | 11/1993 | Horioka et al. | 437/52 |
| 5,371,024 | 12/1994 | Hieda et al. | 437/203 |
| 5,387,528 | 2/1995 | Hutchings et al. | 437/203 |
| 5,599,722 | 2/1997 | Sugisaka et al. | 437/21 |

FOREIGN PATENT DOCUMENTS

| | | |
|---|---|---|
| 0 048 175 | 3/1982 | European Pat. Off. |
| 0 237 684 | 9/1987 | European Pat. Off. |
| 0 423 722 | 4/1991 | European Pat. Off. |
| 0 423 722 A3 | 4/1991 | European Pat. Off. |
| WO 86/04454 | 7/1986 | WIPO |
| WO 93/10559 | 5/1993 | WIPO |

OTHER PUBLICATIONS

Wolf et al., *Silicon Processing for the VLSI Era*, vol. 1, pp. 200–207, 1986.
Wolf, *Silicon Processing for the VLSI Era*, vol. 2, pp. 49–50, 1990.
Patent Abstracts of Japan, vol. 14, No. 288 (E–943) (4231), Jun. 21, 1990, JP–A–02–091976, Mar. 30, 1990.
Patent Abstracts of Japan, vol. 13, No. 268 (E–775), Jun. 20, 1989, JP–A–01 059 847, Mar. 7, 1989.
International Electron Devices Meeting, pp. 793–797, Dec. 9, 1990, K. Shenai, et al., "Optimum Low–Voltage Silicon Power Switches Fabricated Using Scaled Trench MOS Technologies".
Journal of the Electrochemical Society, Solid–State Science and Technology, Jun. 1982, pp. 1278–1282, R.B. Marcus, et al., "The Oxidation of Shaped Silicon Surfaces".
Japanese Journal of Applied Physics, vol. 22, No. 8, Aug. 1983, pp. L514–L516, Yasuharu Sakina, et al., "Two–Dimensional Analysis of Thermal Oxidation of Silicon".

*Primary Examiner*—Brian Dutton
*Attorney, Agent, or Firm*—Oblon, Spivak, McClelland, Maier & Neustadt, P.C.

[57] ABSTRACT

A method of fabricating a semiconductor device which includes the steps of forming a trench (4), and repeating the formation and removal of an oxide film (a sacrificial oxide film) twice to provide a rounded configuration (5b) of an opening portion of the trench (4) and a rounded configuration (6b) of a bottom thereof and to draw defects in a semiconductor layer into a silicon oxide film (8), reducing the defects adjacent the inner wall of the trench (4), whereby electric field concentration on a gate is prevented and the mobility of carriers in channels is improved for an improvement in characteristic, particularly an on-state voltage, of a power device.

13 Claims, 61 Drawing Sheets

FIG. 44

| CONDITIONS | $V_{ON}$ [V] |
|---|---|
| A | 1.44 |
| B | 1.63 |
| C | 1.64 |

METHOD OF FORMING A TRUCK MOS GATE OR A POWER SEMICONDUCTOR DEVICE

BACKGROUND OF THE INVENTION

1. Field of the Invention

The present invention relates to a technique for forming a trench MOS gate to be applied to a semiconductor device, particularly to a power device. The invention also relates to a device isolation technique.

2. Description of the Background Art

A. Background Art (a-1) First Background Art and Problems thereof

FIGS. 65 to 72 are cross-sectional views showing a conventional process for forming a trench MOS gate portion in step-by-step fashion. In particular, FIG. 72 is a cross-sectional view when a trench MOS gate portion 131 has been formed.

Referring to FIG. 65, a doped P type region 2 is initially formed on an upper surface of a semiconductor substrate 1 made of Si and the like. A heavily doped N type region 3 is selectively formed in an upper surface of the doped P type region 2. An oxide film 21 is formed on top of the structure thus obtained. Then a trench 4 is formed which extends through the oxide film 21, the doped P type region 2, and the heavily doped N type region 3 (FIG. 65).

A silicon oxide film 7 is formed in the trench 4 (FIG. 66). After the oxide films 7 and 21 are removed (FIG. 67), a silicon oxide film is formed as a gate oxide film 9 (FIG. 68).

An oxide film which is removed immediately after it is formed, such as the silicon oxide film 7, is referred to as a "sacrificial oxide film" hereinafter. For shaping of the trench and removal of defects, strain and contamination in the trench, the sacrificial oxide film is sacrificed without remaining in a structure to be completed later. The silicon oxide film 7 of 100 to 300 nm in thickness is formed in an atmosphere of oxygen at a temperature ranging from 950° to 1100° C., for example.

The gate oxide film 9 is generally formed by thermal oxidation in an atmosphere of steam at a temperature not more than 1000° C. This is because the oxide film formed by thermal oxidation in an atmosphere of steam is, in general, less defective than the oxide film formed by thermal oxidation in an atmosphere of oxygen and because the oxide film is less defective at a lower temperature.

Low-resistance polycrystalline silicon 10, for example, is filled into the trench 4 (FIG. 69) to form a gate electrode 22 in the trench 4. A silicon oxide film 11 is formed on the gate electrode 22 (FIG. 70). A CVD oxide film 12 is formed on top of the structure provided through the foregoing steps (FIG. 71) and is then shaped by etching into the trench MOS gate portion 131 (FIG. 72).

The trench 4 after the silicon oxide film 7 is once formed and removed has a characteristic configuration as illustrated in FIG. 67. That is, an opening portion and a bottom of the trench 4 are of angular configurations 5c and 6c, respectively.

Such configurations of the trench 4 result in a non-uniform thickness of the gate oxide film 9 formed in the trench 4. In particular, the gate oxide film 9 is most pronouncedly thin in positions reflecting a configuration 5d of the opening portion of the trench 4 and a configuration 6d of the bottom of the trench 4.

Such reduced thickness of the gate oxide film 9 in the trench 4 particularly in the opening portion and bottom of the trench 4 results in gate breakdown position and breakdown voltage failures. In addition, a leak current of the gate oxide film 9 increases.

Further, the angular configurations 5c, 6c of the trench 4 deteriorate the characteristics of the trench MOS gate portion 131. In the step of forming the trench 4, defects are prone to occur about the trench 4. The defects deteriorate the characteristics of channels formed when a predetermined potential is applied to the gate electrode 22, and reduces a mobility in an MOS gate channel which is a basic characteristic of a power device having the trench MOS gate portion 131 due to defects, strain and contamination adjacent an MOS gate interface, resulting in a rise in on state voltage.

(a-2) Second Background Art and Problems thereof

FIGS. 73 to 81 are cross-sectional views showing a process for fabricating lateral IGBTs trench-isolated in an SOI (silicon on insulator) structure in step-by-step fashion.

Referring to FIG. 73, substrates 1e and 1d made of silicon and the like are bonded together, with a silicon oxide film 25 therebetween. P layers 41 and N$^+$ layers 42 are selectively formed in an upper portion of the semiconductor substrate 1e. A silicon oxide film 43 is formed over the semiconductor substrate 1e.

The silicon oxide film 43 is selectively removed so that parts of the P layers 41 and N$^+$ layers 42 are exposed (FIG. 74), and silicon etching is performed using the remaining silicon oxide film 43 as a mask. This permits the semiconductor substrate 1e to be selectively excavated down to form trenches 44 (FIG. 75).

Then, sacrificial oxide films 45 are once selectively formed on inner walls of the trenches 44 by thermal oxidation (FIG. 76), and the silicon oxide films are etched. This permits the removal of parts of the silicon oxide film 25, all of the sacrificial oxide films 45 and all of the silicon oxide film 43, and also permits the trenches 44 to be further excavated down to the level lower than the bottom of the semiconductor substrate 1e (FIG. 77). Thermal oxidation in an atmosphere of steam at a temperature not more than 1000° C. provides isolation oxide films 46 around the remaining semiconductor substrate 1e (including the P layers 41 and N$^+$ layers 42) (FIG. 78).

Polycrystalline silicon 47 is deposited over the structure of FIG. 78 to fill the trenches 44 with the polycrystalline silicon 47 (FIG. 79). The polycrystalline silicon 47 over the semiconductor substrate 1e is selectively removed so that the polycrystalline silicon 47 remains only in the trenches 44. The polycrystalline silicon 47 is covered with field oxide films 48. The field oxide films 48 are also formed on the surface of the semiconductor substrate 1e between the P layers 41 and the N$^+$ layers 42 (FIG. 80). Then a predetermined doped layer is formed, and lateral IGBTs are formed which are isolated from each other by isolating portions 13a having a trench structure (FIG. 81).

Construction of the isolating portions 13a in this manner causes the problems of the thickness of the isolation oxide films 46 similar to the first background art problems. Specifically, as shown in FIG. 78, the semiconductor substrate 1e (including the P layers 41 and N$^+$ layers 42) is of an angular configuration in opening portions 44a and bottoms 44b of the trenches 44. The isolation oxide films 46 in these portions are pronouncedly thinner than those in other portions. The isolation oxide films 46 are prone to be broken particularly in the bottoms 44b. This causes the problem of a lowered isolation breakdown voltage by the isolating portions 13a.

SUMMARY OF THE INVENTION

The present invention is intended for a method of fabricating a semiconductor device. According to the present invention, the method comprises the steps of: (a) anisotropically etching a substrate made of semiconductor to form a trench extending in a direction of the thickness of the substrate; (b) performing a first thermal oxidation to form a first sacrificial oxide film in the trench; (c) removing the first sacrificial oxide film; (d) performing a second thermal oxidation to form a second sacrificial oxide film in the trench after the step (c); (e) removing the second sacrificial oxide film; (f) forming an insulating film comprising a part of a control electrode in the trench after the step (e); and (g) filling the trench to form the control electrode opposed to the substrate through the insulating film comprising the part of the control electrode.

The opening portion and bottom of the trench are rounded by forming the first and second sacrificial oxide films to reduce the defects adjacent the trench. Since acute-angle portions are eliminated at the interface between the semiconductor substrate and the insulating film, the electric field concentration is alleviated in the edges and a uniform electric field distribution is provided.

Preferably, the second thermal oxidation is performed in a water-containing atmosphere, and the first thermal oxidation is performed in an atmosphere of oxygen at a first temperature higher than a second temperature at which the second thermal oxidation is performed.

The bottom of the trench is mainly rounded by the water-containing oxidation. The second oxidation completely removes the region including defects and strains concentrated adjacent the surface of the trench by the first oxidation.

Preferably, the first temperature is not less than 1000° C.

Thus the opening portion of the trench is rounded in configuration.

As above described, since the opening portion and bottom of the trench are rounded and the defects are decreased adjacent the trench, the electric field concentration is avoided, and a carrier mobility is improved. Therefore, a high-speed operation of the device is enabled.

In another aspect of the present invention, the method comprises the steps of: (a) anisotropically etching a substrate made of semiconductor to form a trench having an aspect ratio of from 2 to 30 and extending in a direction of the thickness of the substrate; (b) performing a thermal oxidation in an atmosphere of oxygen at a temperature not less than 1000° C. to form in the trench a sacrificial oxide film having a thickness one-tenth to three-tenths the size of an opening portion of the trench; (c) removing the sacrificial oxide film; (d) forming an insulating film comprising a part of a control electrode in the trench after the step (c); and (e) filling the trench to form the control electrode opposed to the substrate through the insulating film comprising the part of the control electrode.

By suitably controlling the thickness of the sacrificial oxide film, only one formation of the sacrificial oxide film is sufficient. This simplifies the process steps.

In a third aspect of the present invention, the method comprises the steps of: (a) anisotropically etching a substrate made of semiconductor to form a trench extending in a direction of the thickness of the substrate; (b) performing a thermal oxidation to form a sacrificial oxide film in the trench; (c) removing the sacrificial oxide film; (d) oxidizing an inside of the trench at an atmosphere of oxygen at a temperature not less than 1000° C. to form an insulating film comprising a part of a control electrode after the step (c); and (e) filling the trench to form the control electrode opposed to the substrate through the insulating film comprising the part of the control electrode.

The opening portion of the trench is rounded by properly adjusting the atmosphere and temperature when the insulating film comprising the part of the control electrode is formed.

This improves a leak characteristic in the control electrode and reduces a channel resistance.

In a fourth aspect of the present invention, the method comprises the steps of: (a) anisotropically etching a substrate made of semiconductor to form a trench extending in a direction of the thickness of the substrate; (b) providing on the substrate a mask having an edge backing away a predetermined distance from an opening portion of the trench; (c) performing an isotropic dry etching on the substrate by using the mask; (d) oxidizing an inside of the trench in an atmosphere of steam at a temperature not more than 1000° C. after the step (c); and (e) filling the trench to form a control electrode opposed to the substrate through the insulating film comprising the part of the control electrode.

The opening portion and bottom of the trench are rounded by the isotropic dry etching.

This improves the leak characteristic in the control electrode and reduces the channel resistance.

Preferably, the distance is 100 to 400 nm.

The predetermined distance which is not less than 100 nm does not form the angular opening portion of the trench. The predetermined distance which is not more than 400 nm prevents the isotropic etching in the opening portion of the trench from proceeding more than necessary in the direction of the thickness of the substrate and in the lateral direction.

This provides the rounded opening portion of the trench.

Preferably, the isotropic dry etching is performed by using an $O_2/CF_4$ based gas, and a ratio $R=O_2/CF_4$ of the gas satisfies $1<R<5$.

The oxide-based film is deposited by the isotropic etching, thereby smoothing the inner wall of the trench.

Preferably, the method further comprises the steps of: (f) performing a thermal oxidation to form a sacrificial oxide film in the trench; and (g) removing the sacrificial oxide film, the steps (f) and (g) being performed after the step (c) and before the step (d).

The sacrificial oxide film is formed and then removed, providing further rounded opening portion and bottom of the trench.

This improves the leak characteristic in the control electrode and reduces the channel resistance.

In a fifth aspect of the present invention, the method comprises the steps of: (a) providing a semiconductor layer on a substrate including an insulating film at least on its surface; (b) anisotropically etching the semiconductor layer to form a trench extending in a direction of the thickness of the semiconductor layer; (c) performing a thermal oxidation to form a sacrificial oxide film in the trench; (d) removing a part of the substrate which lies under the trench and the sacrificial oxide film; (e) oxidizing an inside of the trench in an atmosphere of oxygen at a temperature not less than 1000° C. to form an isolation oxide film after the step (d); and (f) filling the trench with a burying material.

The formation of the isolation oxide film permits the bottom of the trench to be rounded.

This improves the leak characteristic in the isolation oxide film.

In a sixth aspect of the present invention, the method comprises the steps of: (a) providing a semiconductor layer on a substrate including an insulating film at least on its surface; (b) anisotropically etching the semiconductor layer to form a trench extending in a direction of the thickness of the semiconductor layer; (c) removing a predetermined distance of a part of the insulating film on the substrate which lies under the trench to form a recess having a diameter greater than a diameter of the trench; (d) performing an isotropic dry etching on the semiconductor layer; (e) oxidizing an inside of the trench in an atmosphere of steam at a temperature not more than 1000° C. to form an isolation oxide film after the step (d); and (f) filling the trench with a burying material.

The isotropic dry etching permits the bottom of the trench to be rounded.

This improves the leak characteristic in the isolation oxide film.

Preferably, the predetermined distance is 100 to 400 nm.

The predetermined distance which is not less than 100 nm does not form the angular opening portion of the trench. The predetermined distance which is not more than 400 nm prevents the isotropic etching in the opening portion of the trench from proceeding more than necessary in the direction of the thickness of the substrate and in the lateral direction.

This provides the rounded bottom of the trench.

Preferably, the isotropic dry etching is performed by using an $O_2/CF_4$ based gas, and a ratio $R=O_2/CF_4$ of the gas satisfies $1<R<5$.

The oxide-based film is deposited by the isotropic etching, thereby smoothing the inner wall of the trench.

Preferably, the method further comprises the steps of: (g) performing a thermal oxidation to form a sacrificial oxide film in the trench; and (h) removing the sacrificial oxide film, the steps (g) and (h) being performed after the step (d) and before the step (e).

The sacrificial oxide film is formed and then removed, providing further rounded bottom of the trench.

This improves the leak characteristic in the isolation oxide film.

In a seventh aspect of the present invention, the method comprises the steps of: (a) providing a semiconductor layer on a substrate including an insulating film at least on its surface; (b) anisotropically etching the semiconductor layer to form a trench extending in a direction of the thickness of the semiconductor layer; (c) performing a thermal oxidation to form a sacrificial oxide film in the trench; (d) removing a part of the substrate which lies under the trench and the sacrificial oxide film; (e) forming a polycrystalline semiconductor layer on an inner wall of the trench; (f) oxidizing the polycrystalline semiconductor layer to form an isolation oxide film; and (g) filling the trench with a burying material.

The polycrystalline semiconductor layer covers the corners of the semiconductor layer in the bottom of the trench with good coverage. The polycrystalline semiconductor layer is oxidized to provide the isolation oxide film which permits the bottom of the trench to be rounded.

This improves the leak characteristic in the isolation oxide film.

In an eighth aspect of the present invention, the method comprises the steps of: (a) providing a semiconductor layer on a substrate including a semiconductor oxide film; (b) anisotropically etching the semiconductor layer to form a trench having an aspect ratio of from 2 to 30 and extending in a direction of the thickness of the semiconductor layer; (c) performing a thermal oxidation in an atmosphere of oxygen at a temperature not less than 1000° C. to form in the trench a sacrificial oxide film having a thickness one-tenth to three-tenths the size of an opening portion of the trench; (d) removing the sacrificial oxide film; (e) forming an isolation oxide film in the trench after the step (c); and (f) filling the trench with a burying material.

By properly controlling the thickness of the sacrificial oxide film, only one formation of the sacrificial oxide film is sufficient. This simplifies the process steps.

It is therefore an object of the present invention to provide a technique for improving characteristics, particularly an on state voltage, of a power device having a trench MOS gate portion through an easy process by enhancing the characteristics of the trench MOS gate portion.

It is another object of the present invention to increase an isolation breakdown voltage in a trench isolation for isolating devices from each other in an SOI (silicon on insulator) structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 44 illustrates effects of the fourth preferred embodiment;

DESCRIPTION OF THE PREFERRED EMBODIMENTS

B. First Fabrication Method

The first fabrication method is a method of fabricating a gate oxide film in a trench which is different from the background art method.

(b-1) First Preferred Embodiment

Figure 1:
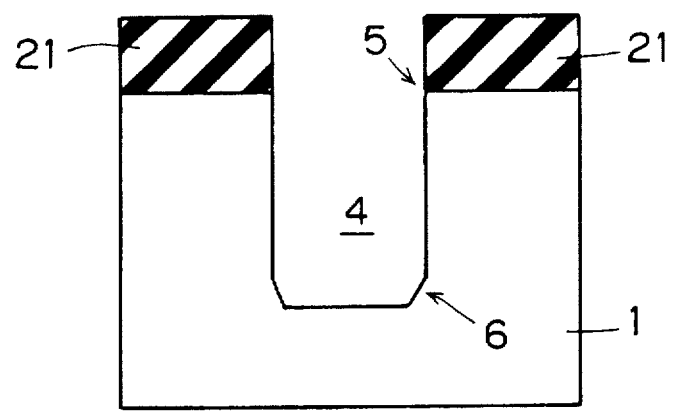
FIGS. 1 to 4 and FIGS. 5A and 5C are cross-sectional views showing a first preferred embodiment in step-by-step fashion according to the present invention.
Figure 2:
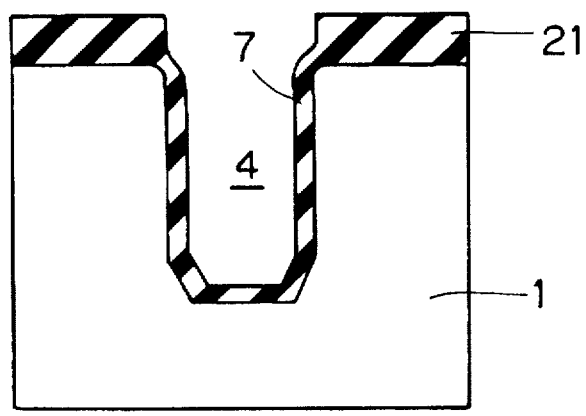
Figure 3:
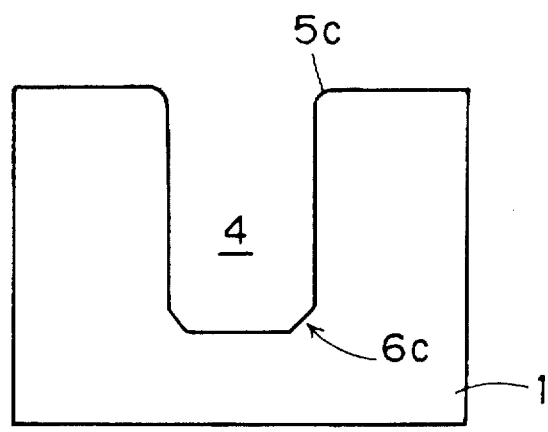
Figure 65:
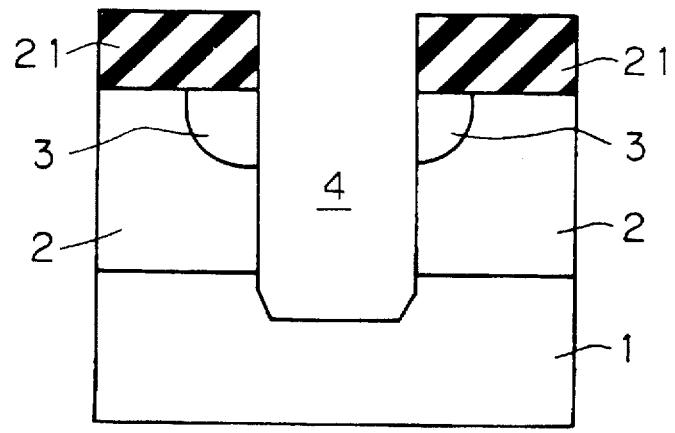
FIGS. 65 to 72 are cross-sectional views showing first prior art in step-by-step fashion.
Figure 66:
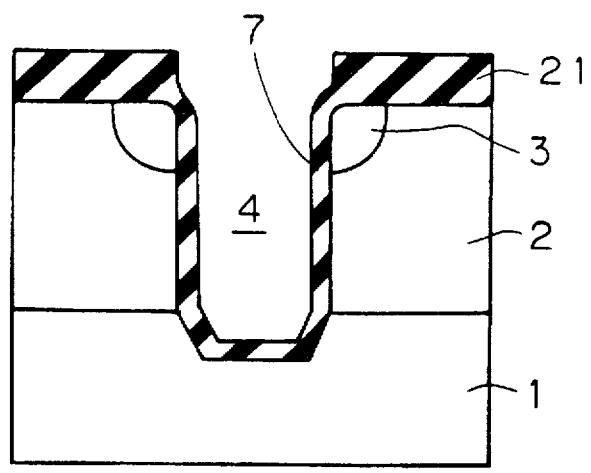
Figure 67:
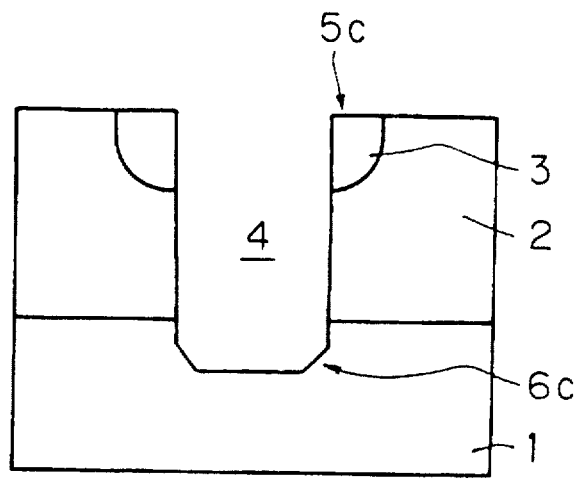
Figure 68:
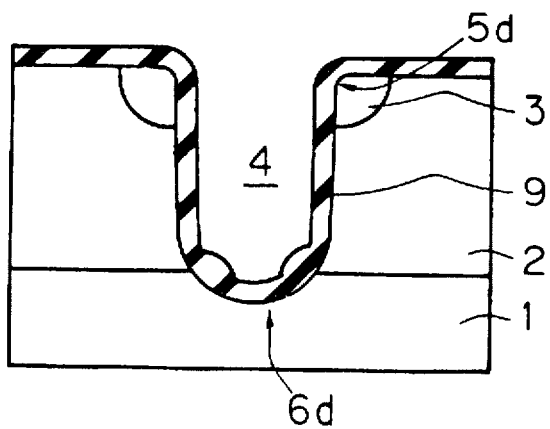
Figure 69:
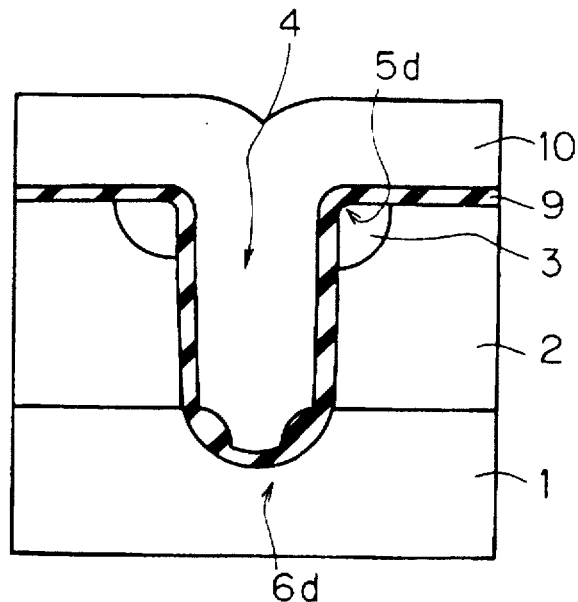
Figure 70:
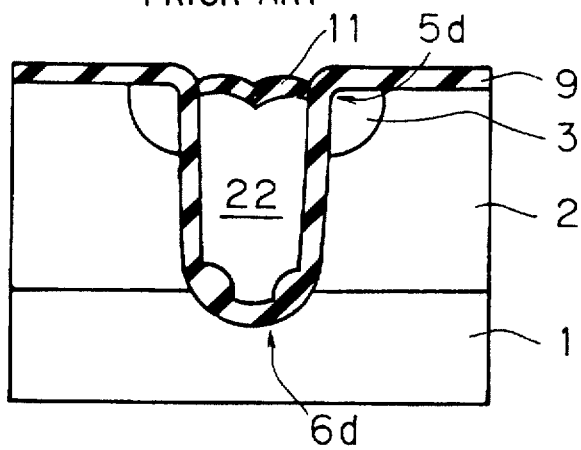
Figure 71:
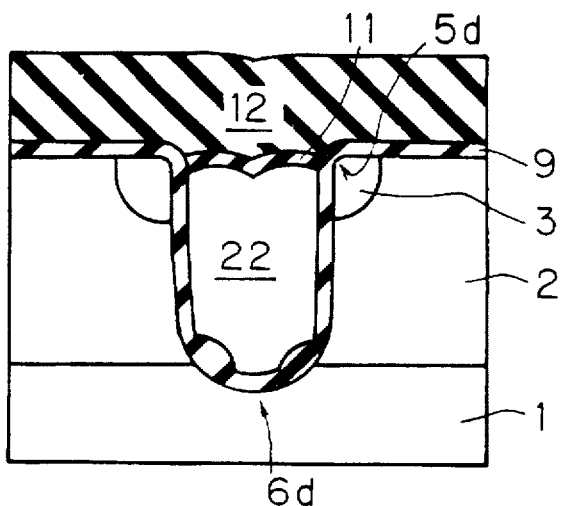

FIGS. 1 to 5 are cross-sectional views showing a method of forming a trench MOS gate portion 132 in step-by-step fashion according to a first preferred embodiment of the present invention. An oxide film 21 is formed on a substrate 1 made of silicon. An opening is selectively formed in the oxide film 21, and anisotropic silicon etching is performed using the oxide film 21 as a mask to form a trench 4 extending in a direction of the thickness of the substrate 1 (FIG. 1). At this time, an opening portion and a bottom of the trench 4 are of angular configurations 5 and 6, respectively. Then, a sacrificial oxide film 7 of about 100 to 300 nm in thickness is formed in an atmosphere of oxygen at a temperature ranging from 950° to 1100° C., for example. (FIG. 2) and is then removed (FIG. 3). These process steps are similar to those of the first background art shown in FIGS. 65 to 67.

Figure 4:
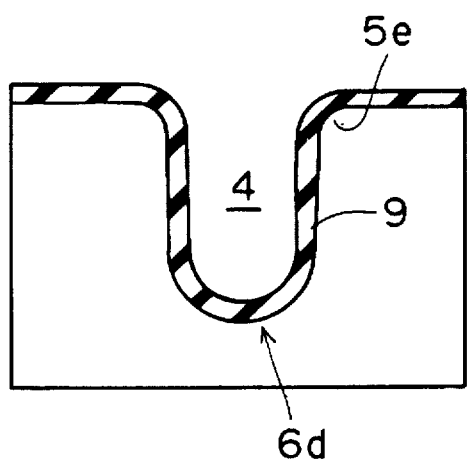

In the first preferred embodiment, thermal oxidation in an atmosphere of oxygen at a temperature not less than 1000° C. (for example, 1215° C.) provides a gate oxide film 9 (FIG. 4). An oxide film formed by thermal oxidation in an atmosphere of oxygen is more effective in rounding the opening portion 5e of the trench 4 than an oxide film formed by thermal oxidation in an atmosphere of steam when it is formed on an inner wall of the trench after a sacrificial oxide film is formed and then removed.

Figure 5A:
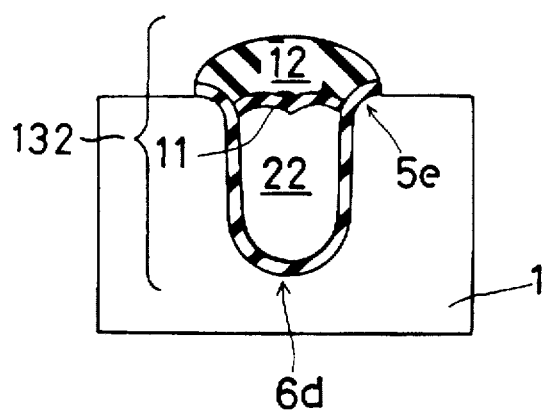
Figure 5B:
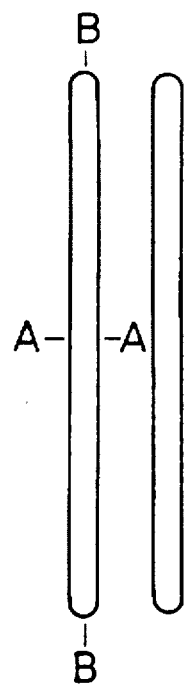
FIG. 5B is a plan view showing the first preferred embodiment.
Figure 5C:
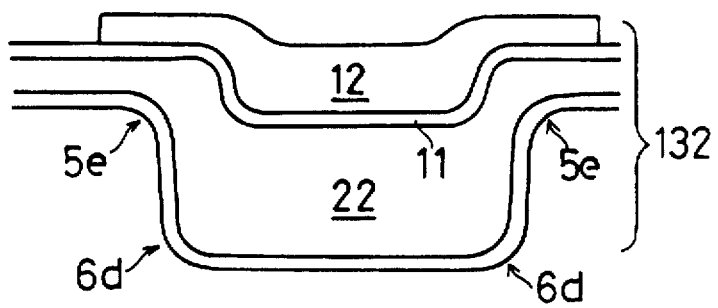
Figure 5D:
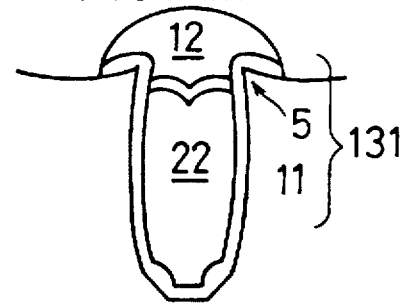
FIGS. 5D and 5E are cross-sectional views showing first prior art.
Figure 5E:
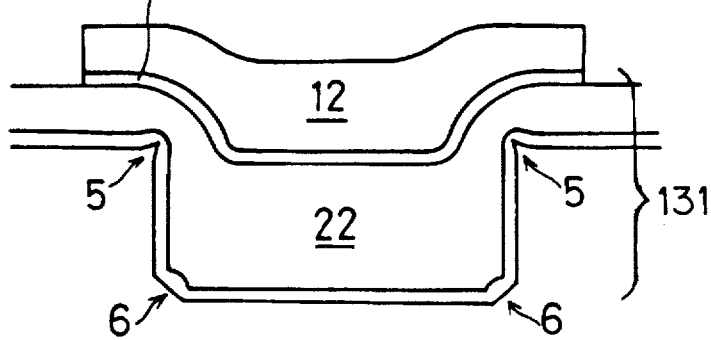

Subsequent process steps of the first preferred embodiment are similar to those of the first background art. Specifically, the trench MOS gate portion 132 is formed (FIG. 5A). FIG. 5A is a cross-sectional view taken along the line A—A of FIG. 5B. FIG. 5B is a plan view illustrating the vicinity of the trench MOS gate portion 132. FIG. 5C is a cross-sectional view taken along the line B—B of FIG. 5B. In the background art, for example, the plan view of the vicinity of the trench MOS gate portion 131 is also shown in FIG. 5B, but the sections thereof taken along the lines A—A and B—B are shown in FIGS. 5D and 5E, respectively.

Figure 6:
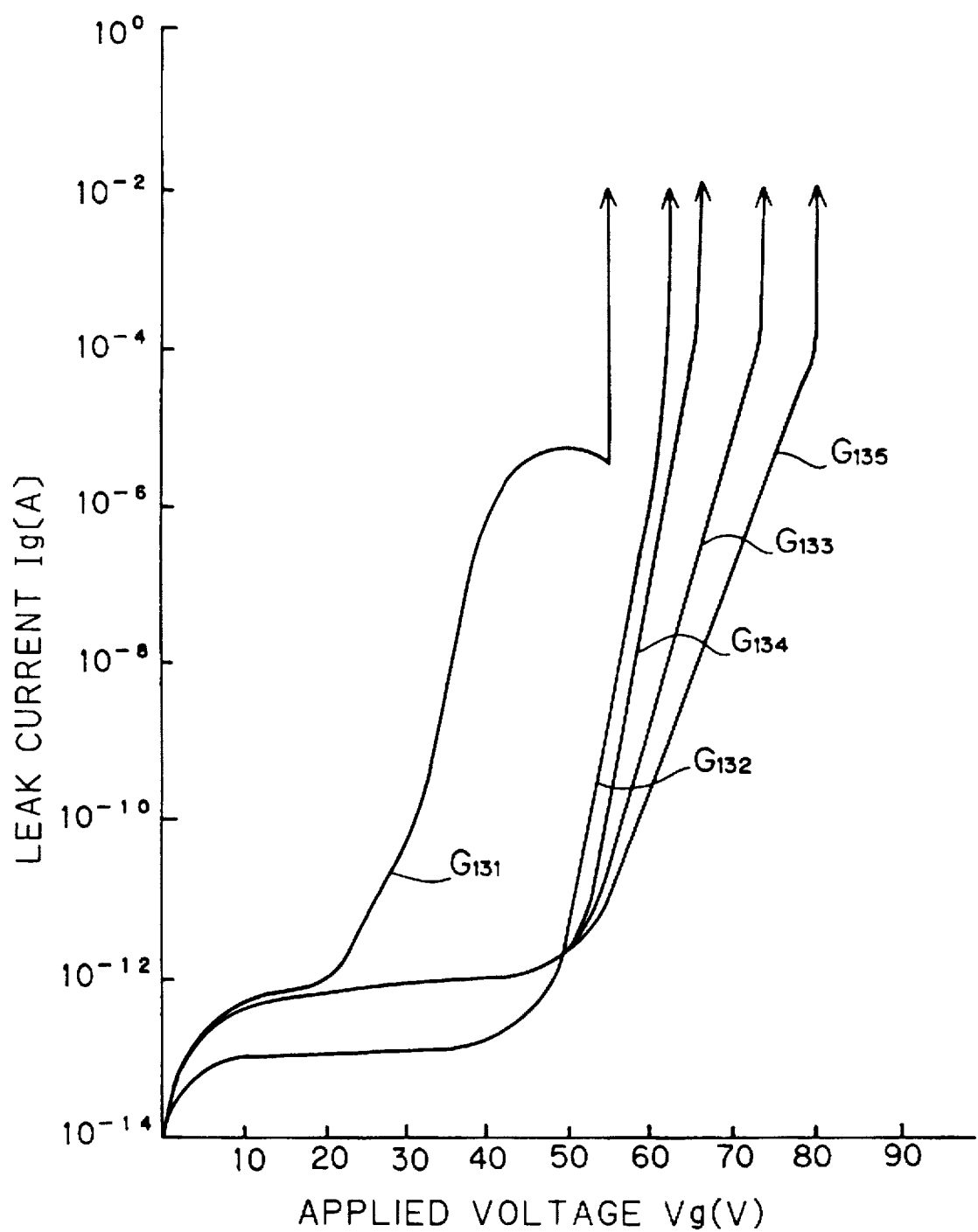
FIG. 6 is a graph illustrating effects of the first preferred embodiment.

FIG. 6 is a graph illustrating the relation (leak characteristic) between an applied voltage Vg and a leak current Ig when a simple capacitance structure including no diffused layer is formed adjacent the trench. The curve $G_{131}$ represents the characteristic of the background art trench MOS gate portion 131 shown in FIGS. 5D and 5E wherein the trench has the angular opening portion and bottom, and the curve $G_{132}$ represents the characteristic of the trench MOS gate portion 132 shown in FIGS. 5A and 5C to which the present invention is applied.

Figure 72:
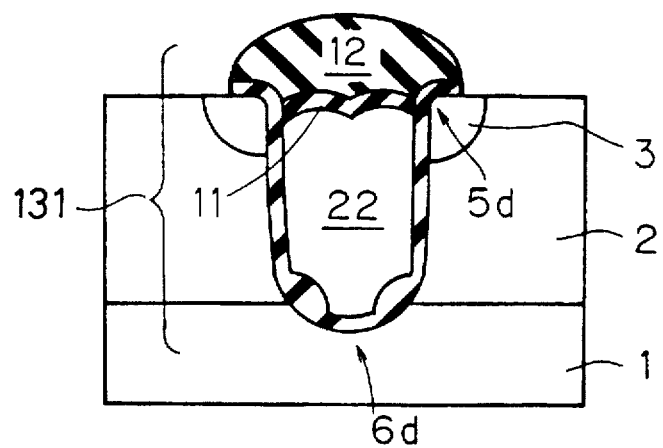

The voltage Vg is applied between the substrate 1 and a gate electrode 22. The trench MOS gate portion 131 of FIG. 72 is measured when the doped P type region 2 and the heavily doped N type region 3 are not formed on the substrate 1. The gate oxide films of the trench MOS gate portions 131, 132 are designed to be about 750 angstroms in thickness.

The leak characteristic of the trench MOS gate portion 131 abruptly deteriorates when the applied voltage Vg substantially exceeds 30 V. It will be understood that the isolation breakdown voltage for the trench MOS gate portion 131 is about 55 V.

On the other hand, the leak characteristic of the trench MOS gate portion 132 does not substantially deteriorate when the applied voltage exceeds 40 V, and the isolation breakdown voltage for the trench MOS gate portion 132 is more than 60 V.

The reasons are not evident why the configuration of the trench 4 is improved by changing the conditions under which the gate oxide film 9 is formed from the conventional conditions. However, the improved configuration of the trench 4 permits the trench MOS gate portion 132 to have the improved leak characteristic and improved isolation breakdown voltage over the trench MOS gate portion 131 of the first background art.

C. Second Fabrication Method

The second fabrication method is a technique for smoothing the trench configuration by isotropic plasma etching.

(c-1) Second Preferred Embodiment

FIGS. 7 to 14 are cross-sectional views showing a method of forming a trench MOS gate portion 133 in step-by-step fashion according to a second preferred embodiment of the present invention associated with claims 6 to 9. The structure shown in FIG. 1 is formed in the same manner as the first preferred embodiment. As above described, the opening portion and bottom of the trench 4 are of angular configurations 5 and 6, respectively.

Figure 7:
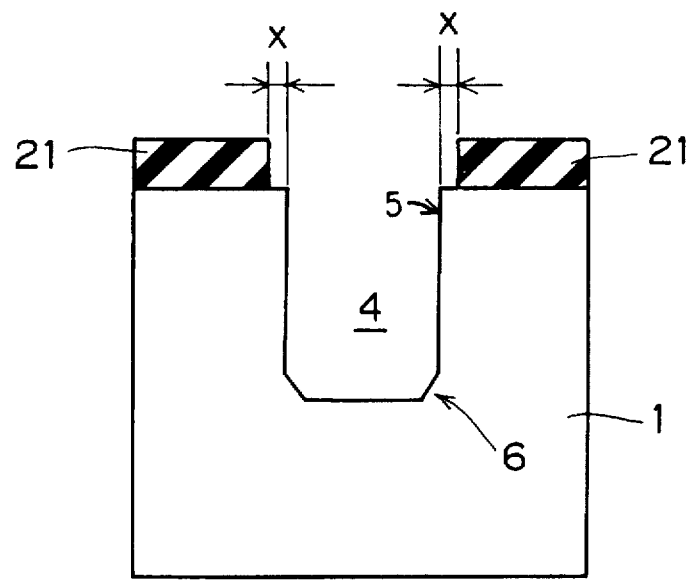
FIGS. 7 to 14 are cross-sectional views showing a second preferred embodiment in step-by-step fashion according to the present invention.
Figure 8:
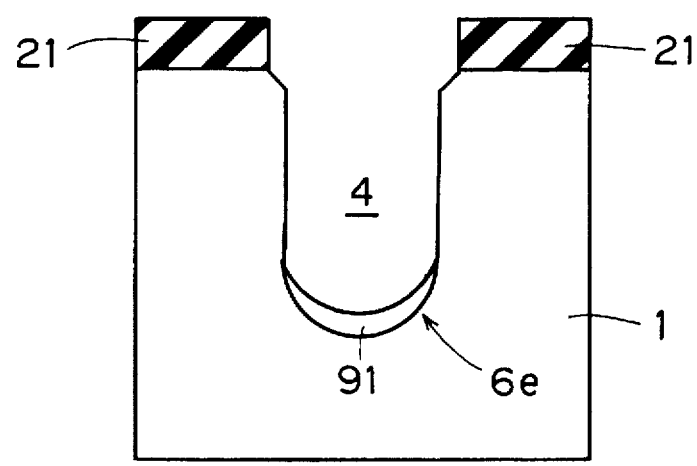
Figure 9:
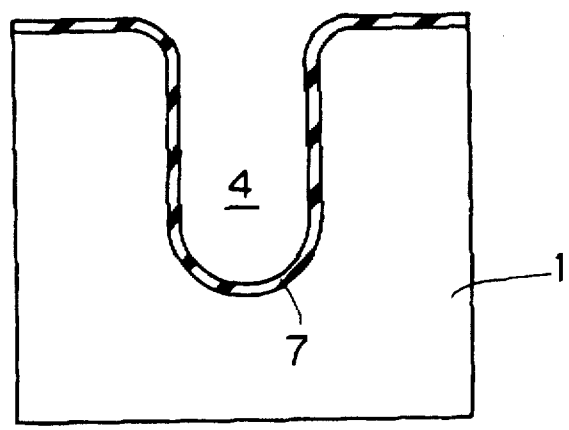

The oxide film 21 is removed selectively in a portion adjacent the opening of the trench 4 so that the oxide film 21 backs away a distance x from the trench 4 (FIG. 7). Then isotropic plasma etching is performed on silicon using an $O_2/CF_4$ based gas. The result is a chamfered opening portion of the trench 4 and a rounded bottom configuration 6e thereof having no angular portions. At this time, an oxide-based film 91 is produced adjacent the bottom of the trench 4 as will be described later in detail (FIG. 8).

Figure 10:
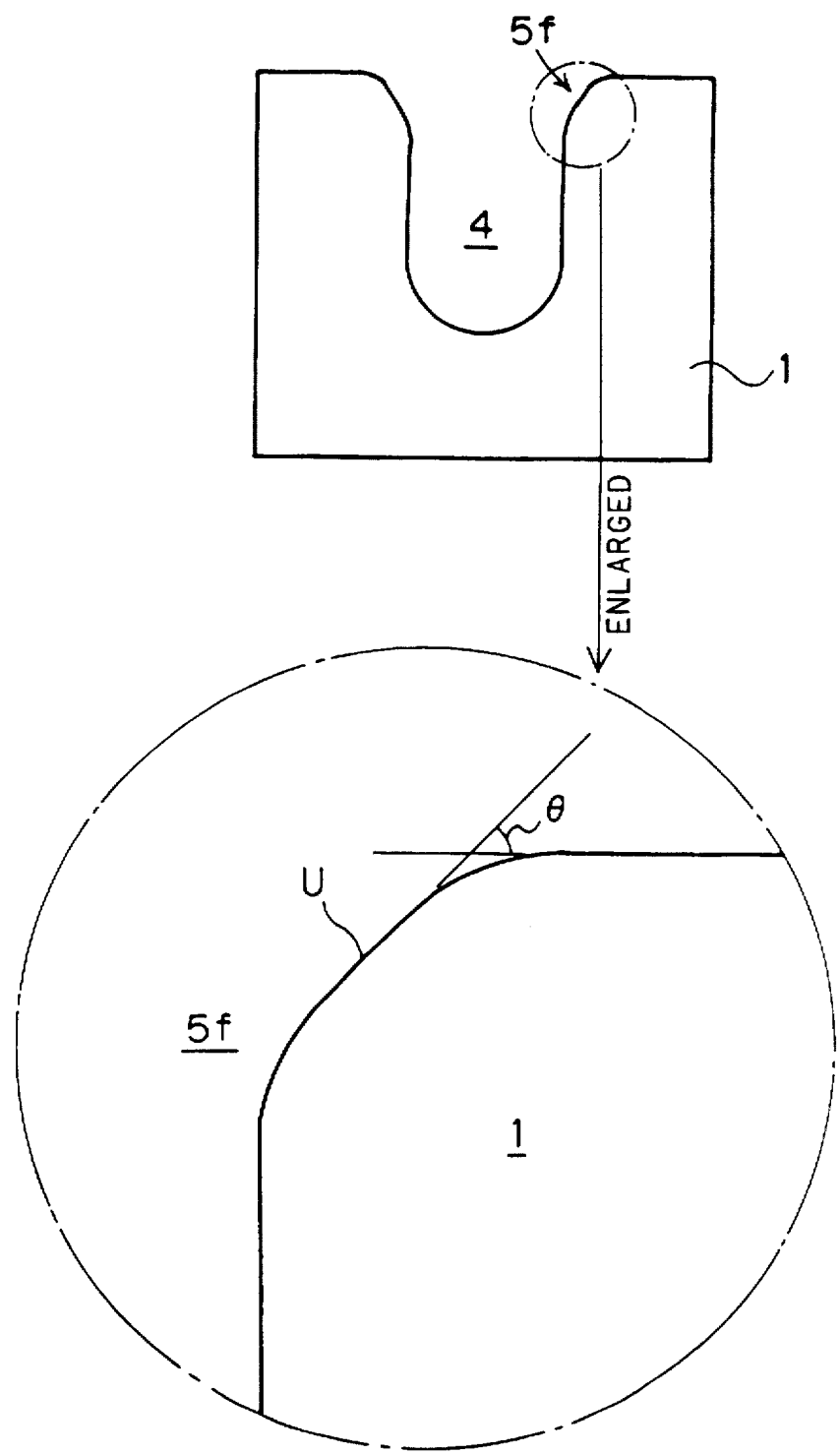

After the film 91 and the oxide film 21 are removed, the sacrificial oxide film 7 is once formed (FIG. 9) and is then removed, thereby providing a more smoothed configuration 5f of the opening portion of the trench 4 (FIG. 10). When the opening portion of the trench 4 is shown on an enlarged scale, the configuration 5f sometimes has a linear portion U. In this case, the linear portion U and the upper surface of the substrate 1 form an angle θ which falls within the range of 30 to 60 degrees. When the configuration 5f does not have the linear portion U, a tangent line drawn from a portion of the configuration 5f which has the smallest radius of curvature and the upper surface of the substrate 1 form an angle θ which falls within the range of 30 to 60 degrees.

Figure 11:
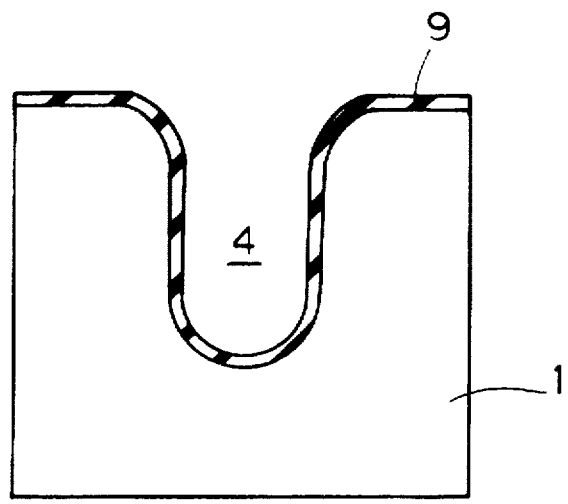

Then the gate oxide film 9 is formed by thermal oxidation in an atmosphere of steam at a temperature not more than 1000° C. (for example, 950° C.) (FIG. 11). In the first preferred embodiment, the thermal oxidation is performed in the atmosphere of oxygen at the temperature not less than 1000° C. for the purpose of forming the gate oxide film 9. However, after the isotropic plasma etching, thermal oxidation in the atmosphere of steam at the temperature not more than 1000° C. provides better characteristics. The reasons therefor is not evident at the present time.

Figure 12:
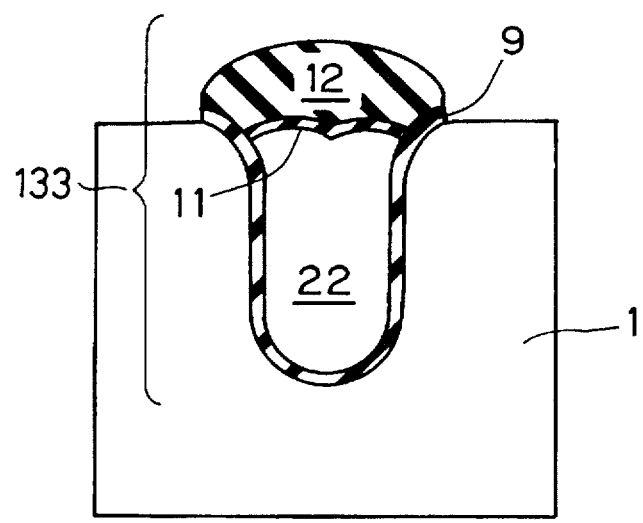
Figure 13:
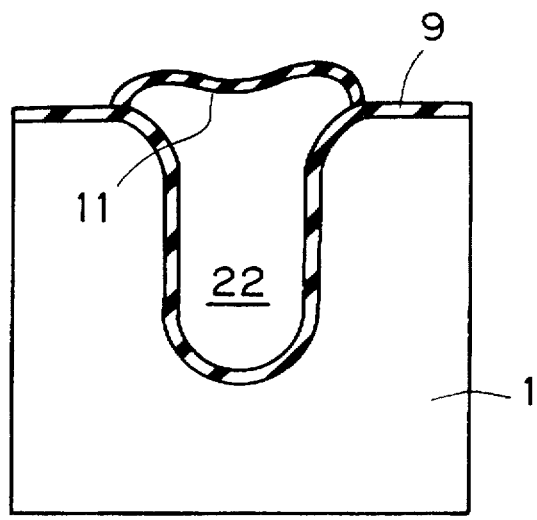
Figure 14:
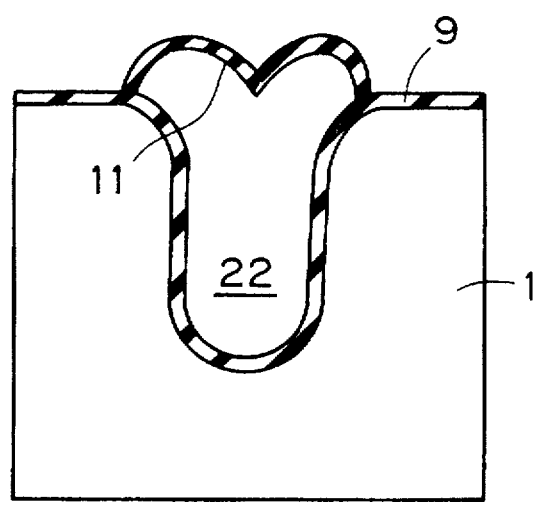

Then, the trench 4 is filled with low-resistance polycrystalline silicon and the gate electrode 22 is formed. A silicon oxide film 11 is formed on the gate electrode, and an oxide film 12 is deposited over the top surface by the CVD process, for example. Further, the gate oxide film 9 and the oxide film 12 are selectively left by etching to form the trench MOS gate portion 133 (FIG. 12). The gate electrode 22 may extend to a higher level than the upper surface of the substrate 1 as shown in FIGS. 13 and 14.

For the formation of the gate electrode 22, metal films (W, Mo, Al, Ti) and metallic compounds (WSi, MoSi$_2$, AlSi, TiSi) may be substituted for the low-resistance polycrystalline silicon.

The leak characteristic of the trench MOS gate portion 133 formed in this manner is represented as the curve $G_{133}$ of FIG. 6. The leak characteristic of the trench MOS gate portion 133 is about an order of magnitude less than that of the trench MOS gate portion 132 of the first preferred embodiment when the applied voltage Vg is low (not more than 40 V), but is greater when the applied voltage Vg is high (not less than 50 V). That is, when the present invention is applied to a device having a main breakdown voltage which is less than the isolation breakdown voltage of the gate oxide film, the trench MOS gate portion 132 is more suitable than the trench MOS gate portion 133. Conversely, when the present invention is applied to a device having a main breakdown voltage which is more than the isolation breakdown voltage of the gate oxide film, the trench MOS gate portion 133 is more suitable than the trench MOS gate portion 132.

In the second preferred embodiment, if thermal oxidation is performed in an atmosphere of oxygen at a temperature not less than 1000° C. for the formation of the gate oxide film 9, the leak characteristic of the resultant trench MOS gate portion is substantially equal to or less than that of the trench MOS gate portion 132 when the applied voltage Vg is high (not less than 50 V).

Figure 15:
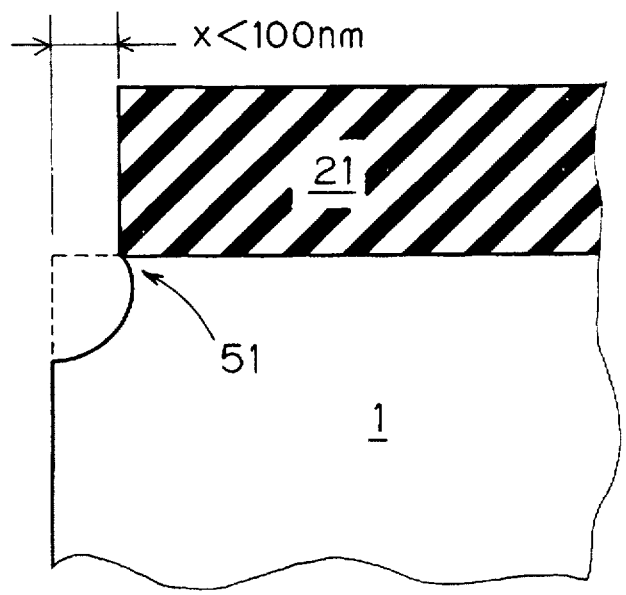
FIGS. 15 and 16 are cross-sectional views illustrating the second preferred embodiment.
Figure 16:
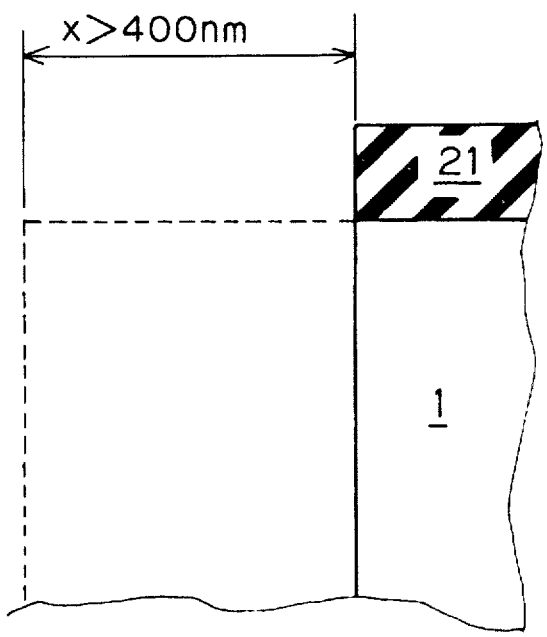

The distance x backed away by the oxide film 21 from the opening portion of the trench 4 is preferably not less than 100 nm and not more than 400 nm. FIGS. 15 and 16 are cross-sectional views on an enlarged scale illustrating the opening portion of the trench 4 after the isotropic plasma etching when the distance x is less than 100 nm and when the distance x is greater than 400 nm, respectively. The broken lines of FIGS. 15 and 16 indicate the configuration of the substrate 1 before the isotropic plasma etching.

With the distance x less than 100 nm, the opening portion of the trench 4 has an angular edge 51. With the distance x greater than 400 nm, the etching proceeds in the direction of the thickness of the substrate 1, and the opening portion of the trench 4 directly reflects the configuration of the oxide film 21 and is not chamfered. Therefore the distance x preferably ranges from 100 nm to 400 nm.

Figure 17:
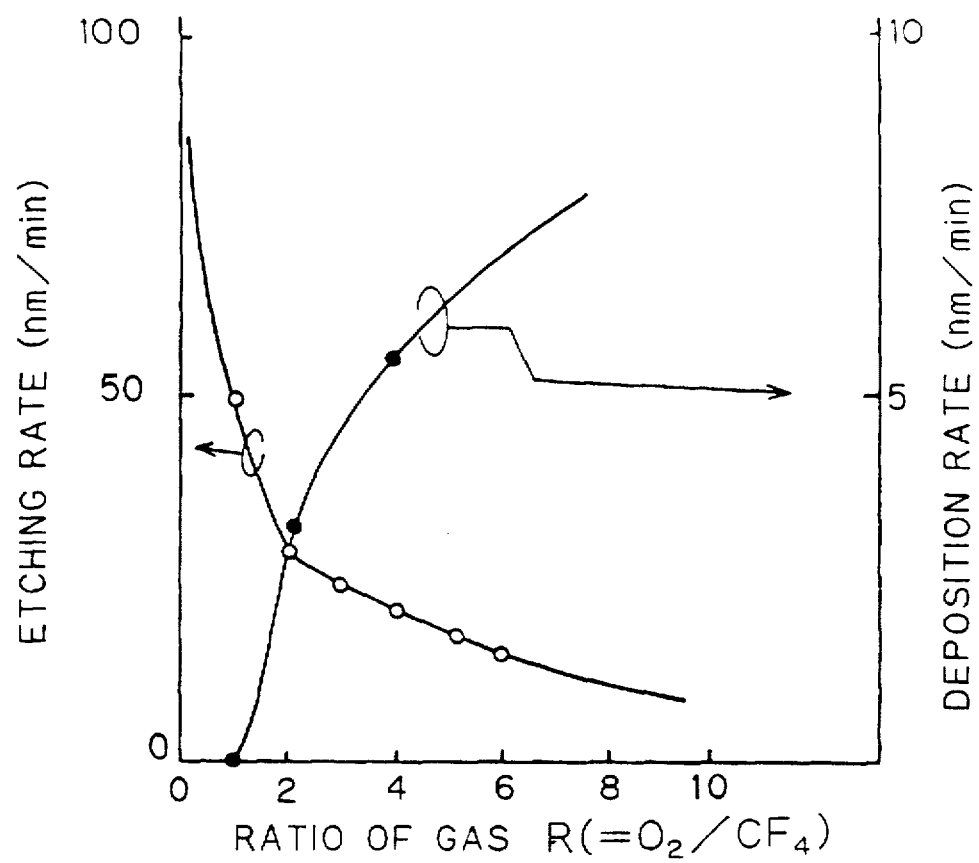
FIG. 17 is a graph illustrating the second preferred embodiment.

The ratio R=O$_2$/CF$_4$ of the gas used for the isotropic plasma etching preferably satisfies 1<R<5. FIG. 17 is a graph illustrating how a silicon etching rate and a deposition rate of the oxide-based film vary as the ratio R of the gas varies. The graph shows that, as the ratio R of the gas increases, the etching rate decreases and the deposition rate of the film increases.

Figure 18:
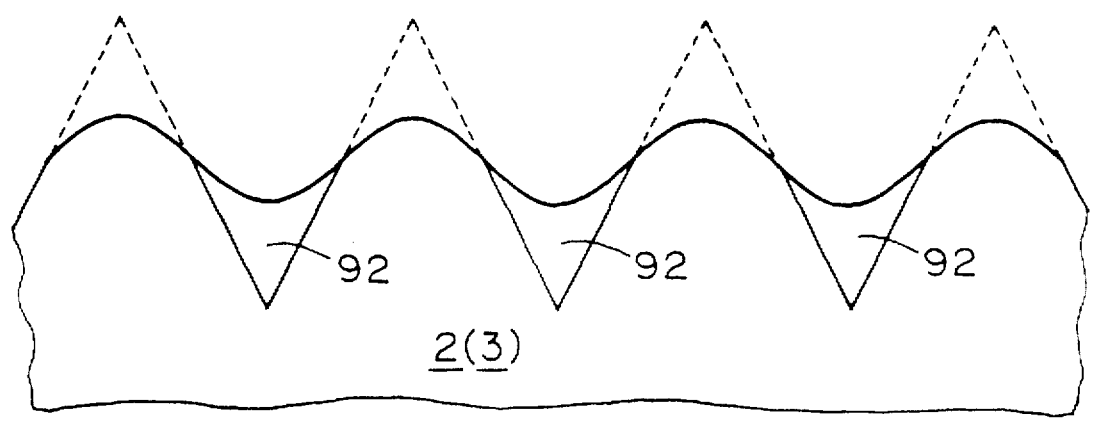
FIG. 18 is a schematic cross-sectional view illustrating the second preferred embodiment.

When the ratio R is not more than 1, the etching rate is 50 nm/min. and substantially no film is deposited. This does not cause the etching surface to be smoothed but results in a rough surface. When R>1, the etching surface is smoothed. FIG. 18 is a schematic cross-sectional view of an etched surface of silicon (for example, the substrate 1) in exaggeration when R is greater than 1. The broken lines of FIG. 18 indicate the configuration of the silicon before etching. The deposition of an oxide-based film 92 permits recesses to be filled, and etching eliminates projections. As a result, the configuration of the etched surface is considered to be smoothed.

When the ratio R is not less than 5, the silicon etching rate is generally equal to the deposition rate of the oxide-based film. Thus the substantial etching rate is not more than 15 nm/min. and it takes tens of minutes for 200 to 300 nm etching required to chamfer the opening portion of the trench 4. This significantly reduces the productivity and makes it difficult to control the sample temperatures during etching, which is not practical. For these reasons, the ratio R is preferably less than 5.

In this manner, the film deposition simultaneous with the silicon etching allows the inner wall of the trench 4 to be smoothed, and the breakdown voltage of the trench MOS gate portion 133 is considered to increase.

Figure 19:
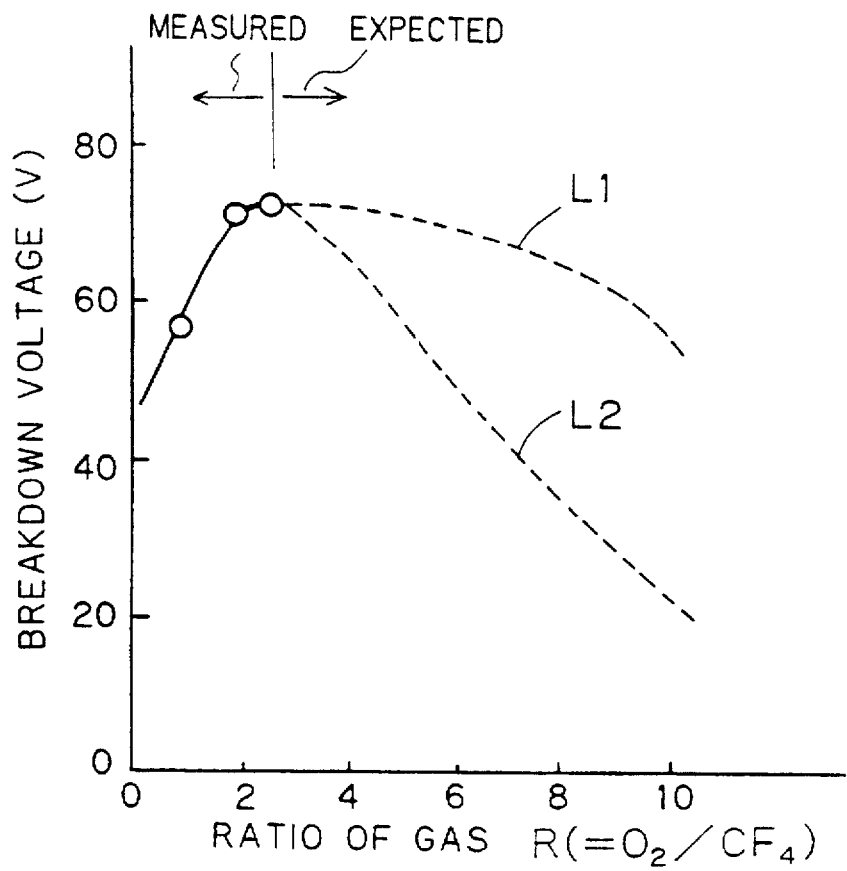
FIG. 19 is a graph illustrating the second preferred embodiment.

FIG. 19 is a graph illustrating how the breakdown voltage of the trench MOS gate portion 133 varies with variation in the ratio R of the gas. The breakdown voltage is actually measured when R is not more than 3 but is not measured when R is more than 3. The upper branch L1 of the graph indicates a breakdown voltage expected from the deposition rate of the oxide-based film, and the lower branch L2 is a breakdown voltage expected from the etching rate. Thus, a breakdown voltage in a region between the branches L1 and L2 is expected to be obtained in practice.

(c-2) Third Preferred Embodiment

Characteristics improved over those of the trench MOS gate portion 131 of the first background art are provided when the process step of forming and then removing the sacrificial oxide film 7 is omitted in the second preferred embodiment. A leak characteristic of a trench MOS gate portion 134 formed in this case is represented by the curve $G_{134}$ of FIG. 6.

The leak characteristic of the trench MOS gate portion 134 is less than that of the trench MOS gate portion 133 while the trench MOS gate portion 134 provides a lower leak current and a higher breakdown voltage than the trench MOS gate portion 131. This is considered to result from the fact that the configuration of the opening portion of the trench is further rounded by the step of forming and removing the sacrificial oxide film 7.

In the application of the present invention to a device handling a large current of tens of Amperes or more, a large displacement current generated at the gate during the turn-on and turn-off operations requires the increase in gate breakdown voltage, and the application of the second preferred embodiment is preferable.

However, when the leak current Ig is less than about $10^{-8}$ A, there is a small difference in leak characteristic between the trench MOS gate portions 133 and 134. Thus the trench MOS gate portion 134 requiring fewer process steps is more advantageous than the trench MOS gate portion 133 in terms of cost versus actual performance. The second and third preferred embodiments may be used and applied depending on the purposes of devices to be applied.

(c-3) Comparable Example

Figure 20:
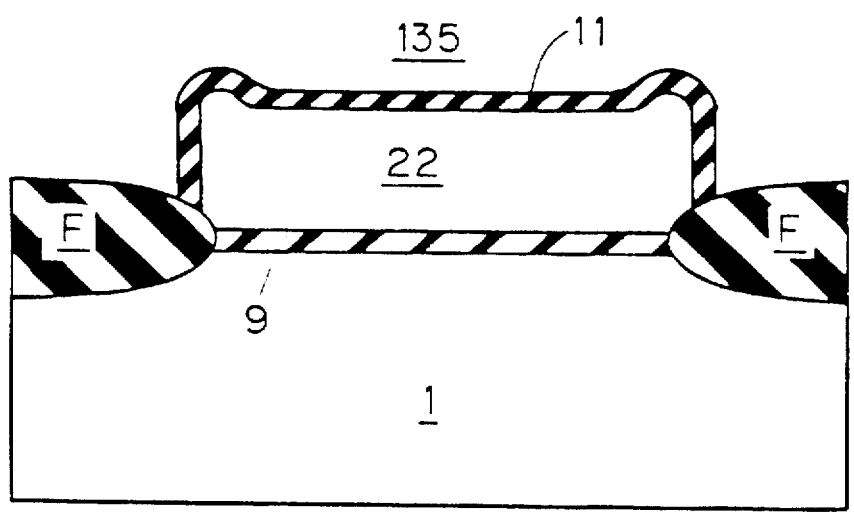
FIG. 20 is a cross-sectional view of a comparable example.

In FIG. 6, there is also shown a curve $G_{135}$ indicative of the leak characteristic of an MOS gate structure 135 of the type parallel to the surface of the substrate 1 for the purpose of comparison. FIG. 20 is a cross-sectional view illustrating the MOS gate structure 135. The gate oxide film 9 surrounded by an isolation oxide film F is formed on the substrate 1, and the gate electrode 22 is formed on the gate oxide film 9. The gate electrode 22 is covered with the silicon oxide film 11. The gate oxide film 9 is formed by thermal oxidation in an atmosphere of steam at a temperature not more than 1000° C., like the second preferred embodiment. The voltage Vg is applied between the substrate 1 and the gate electrode 22.

It will be appreciated from FIG. 6 that the trench MOS gate portions 132, 133, 134 provide desirable characteristics which are somewhat inferior to but close to the characteristics of the MOS gate structure 135.

(c-4) Application to Power Device

The trench MOS gate portions 132, 133, 134 of the first to third preferred embodiments may be applied to various vertical power devices.

Figure 21:
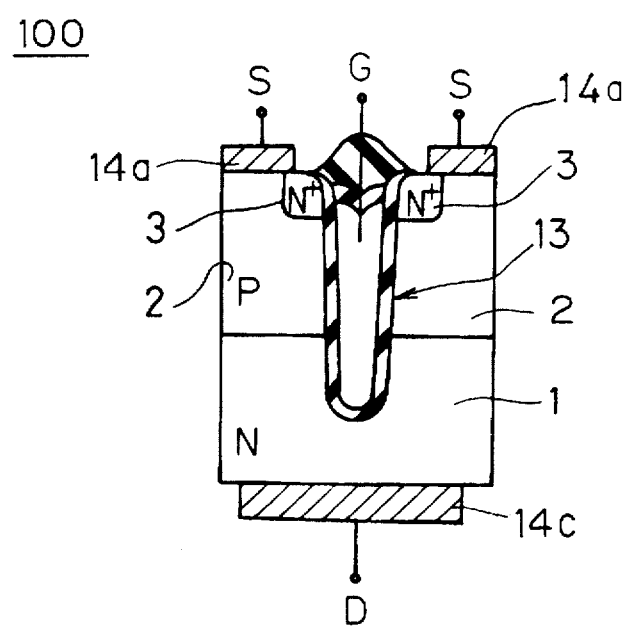
FIGS. 21 to 23 are cross-sectional views of devices to which the first to third preferred embodiments are applied.

FIG. 21 is a cross-sectional view of a trench gate type MOSFET 100. A doped P type region 2 is formed on the N type semiconductor substrate 1, and a heavily doped N type region 3 is formed selectively in an upper surface of the doped P type region 2. A trench extends through the doped P type region 2 and heavily doped N type region 3 into the N type semiconductor substrate 1 to form a trench MOS gate portion 13. Source electrodes 14a are formed on the doped P type region 2 and in contact with the heavily doped N type region 3. A drain electrode 14c is formed in contact with the N type semiconductor substrate 1. The present invention may be applied to this trench MOS gate portion 13 to improve the leak characteristic.

Figure 22:
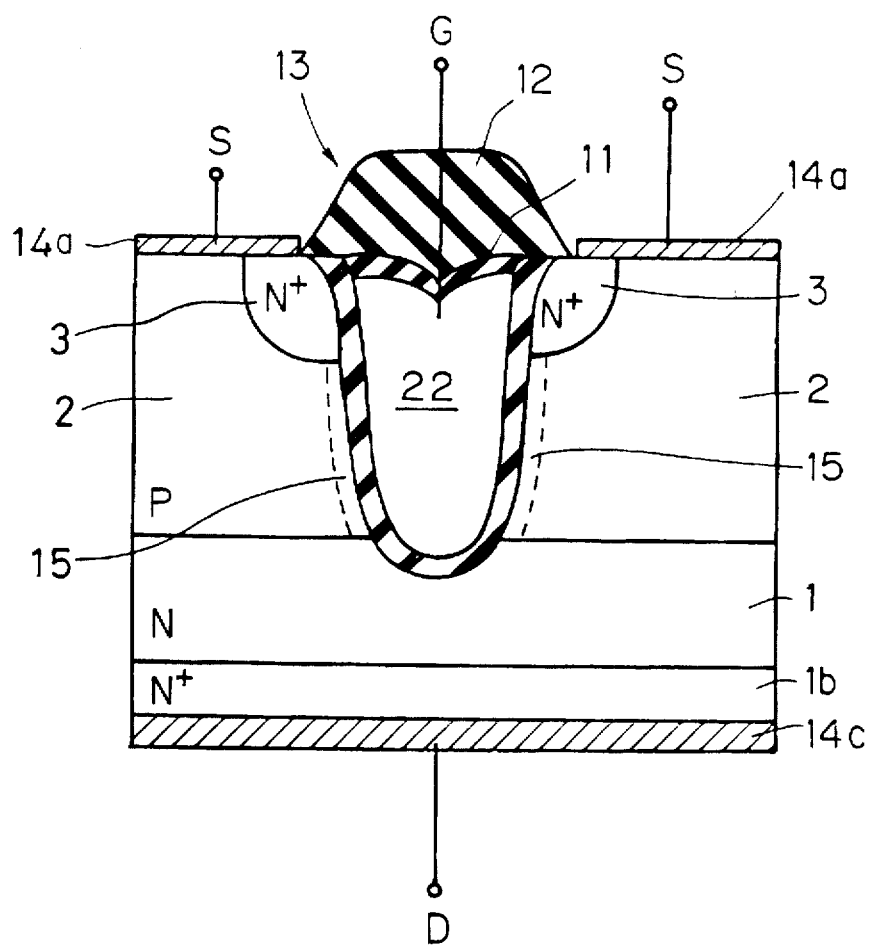

FIG. 22 is a cross-sectional view of another trench gate type MOSFET 200. Compared with the trench gate type MOSFET 100, the trench gate type MOSFET 200 comprises an $N^+$ layer 1b between the drain electrode 14c and the N type semiconductor substrate 1. The present invention may be also applied to such a device.

The trench gate MOSFETs represent an improvement over the conventional MOSFETs in that a higher degree of integration decreases an on-state resistance. The application of the trench MOS gate portion forming method of the present invention to such power devices has the effect of improving the gate breakdown voltage because of suppressed electric field concentration adjacent the gate electrode 22.

Figure 23:
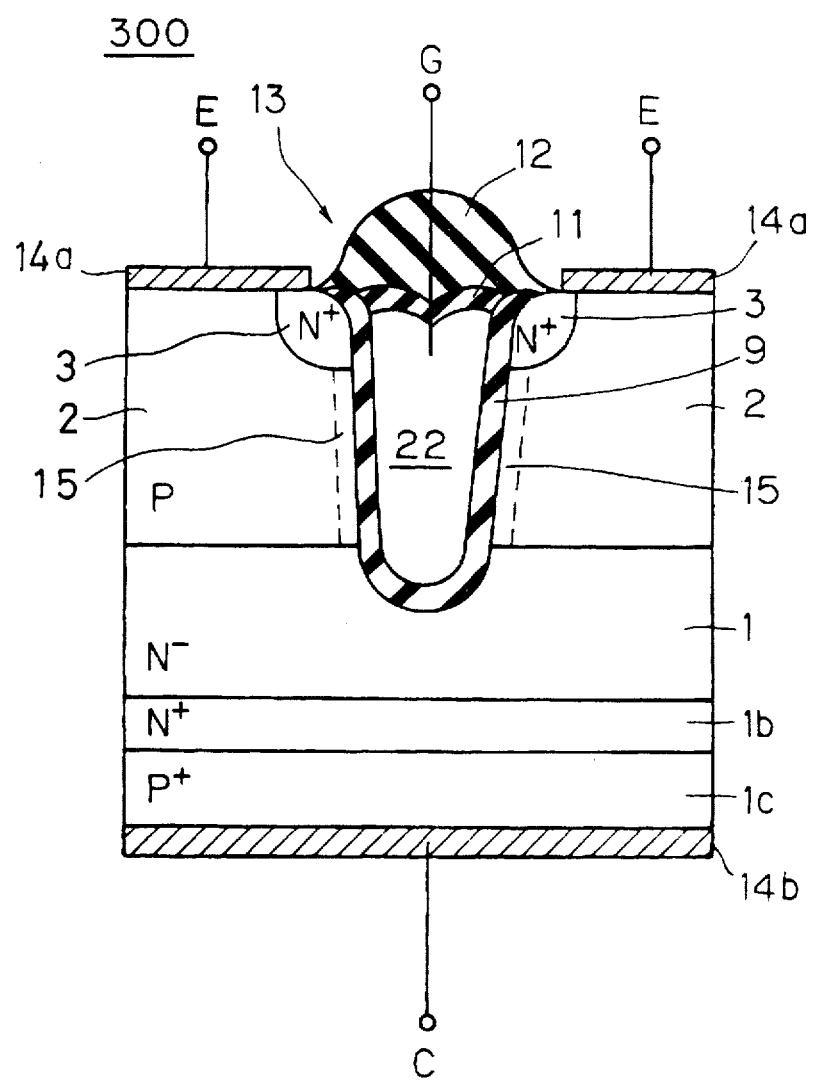
Figure 24:
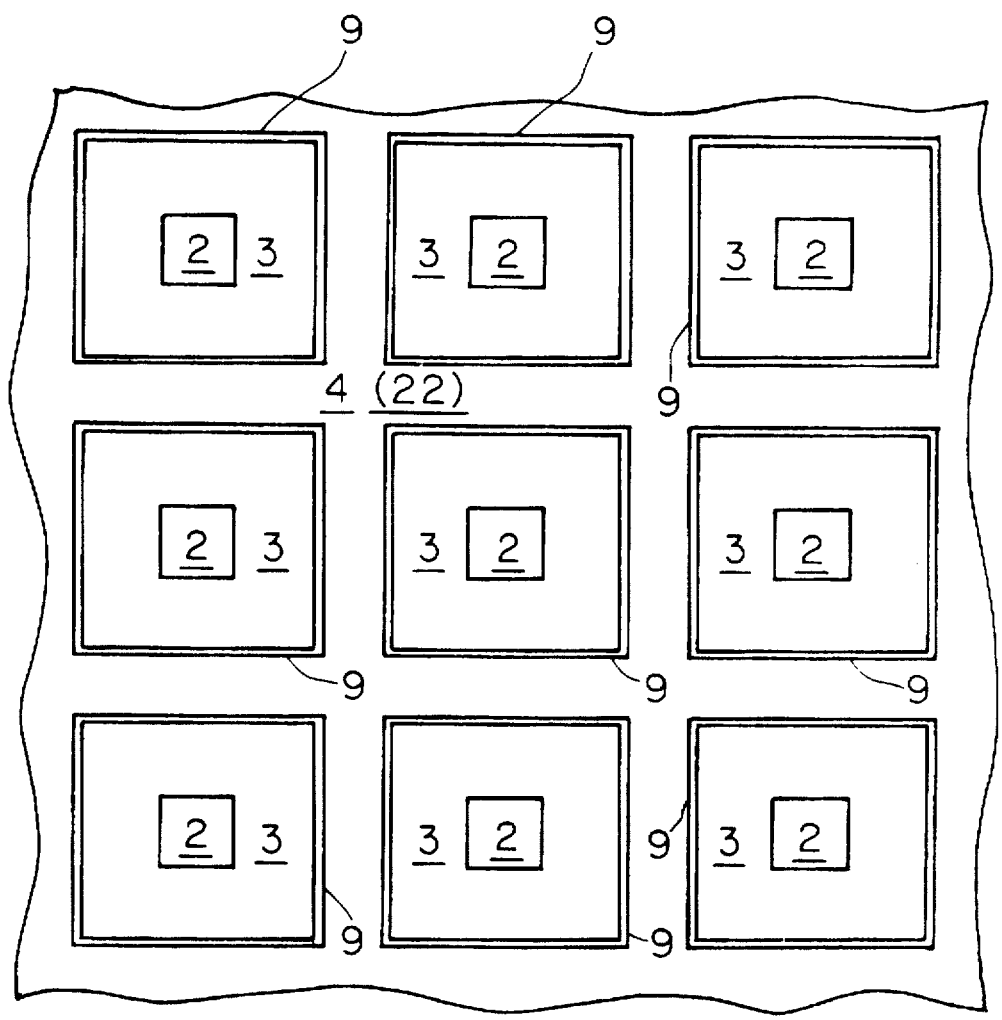
FIGS. 24 to 28 are plan views of devices to which the first to third preferred embodiments are applied.
Figure 25:
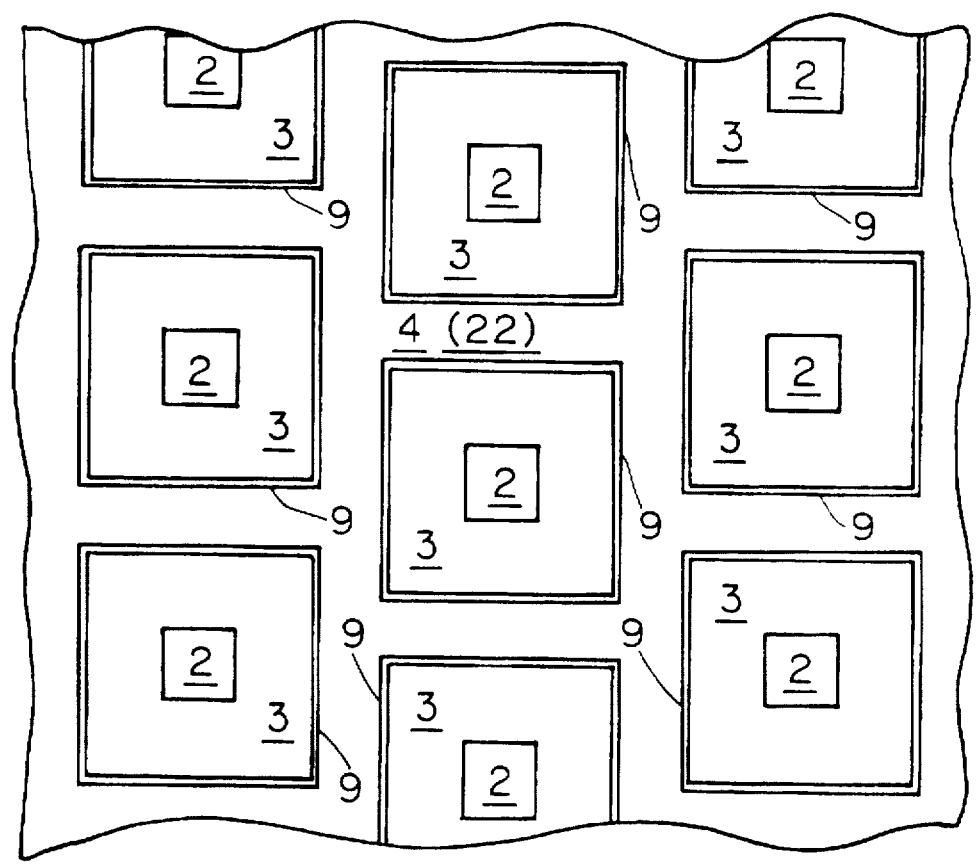

FIG. 23 is a cross-sectional view of a trench gate type IGBT (insulated gate bipolar transistor) 300. The trench gate type IGBT 300 comprises a $P^+$ layer 1c formed on a lower surface (a surface on which the N type semiconductor substrate 1 is not formed) of the $N^+$ layer 1b of the trench gate type MOSFET 200. A collector electrode 14b is formed in contact with the $P^+$ layer 1c. The source electrodes 14a for the trench gate type MOSFET 200 function as an emitter electrode for the trench gate type IGBT 300. A channel region 15 is formed in the doped P type region 2 around the gate oxide film 9 by the application of a predetermined potential to the gate electrode 22.

FIGS. 24 to 27 are plan views showing the top structures of the trench gate type IGBTs and trench gate type MOSFETs. The trench gate type MOSFETs 100, 200 and the trench gate type IGBT 300 may be constructed as shown in the plan views of FIGS. 24 to 27. However, the top structures shown in FIGS. 26 and 27 have some differences in cross-section from the structures shown in FIGS. 22 and 23.

Figure 26:
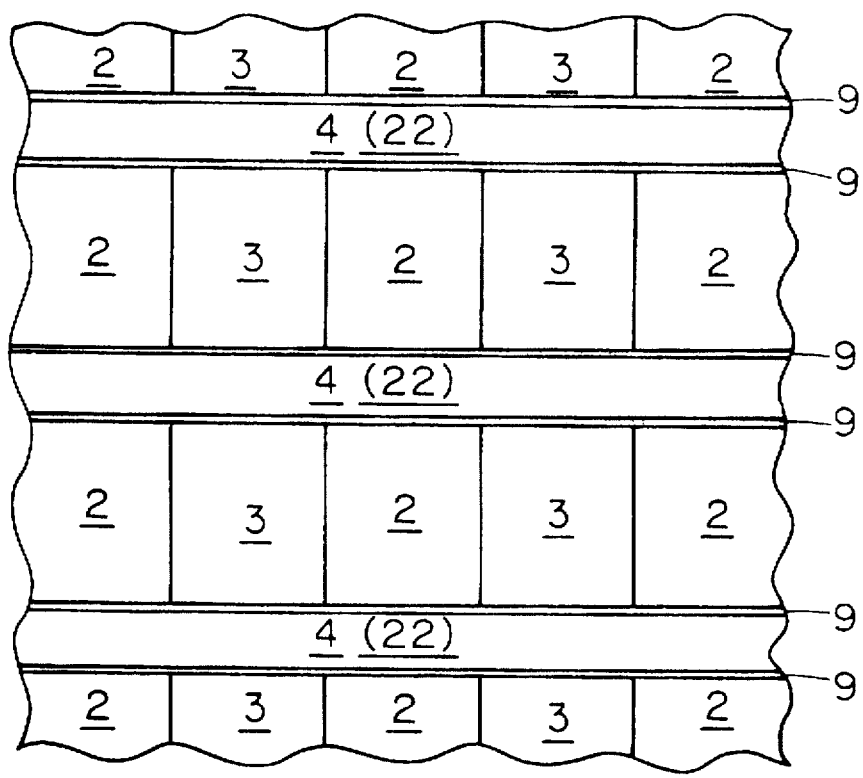
Figure 27:
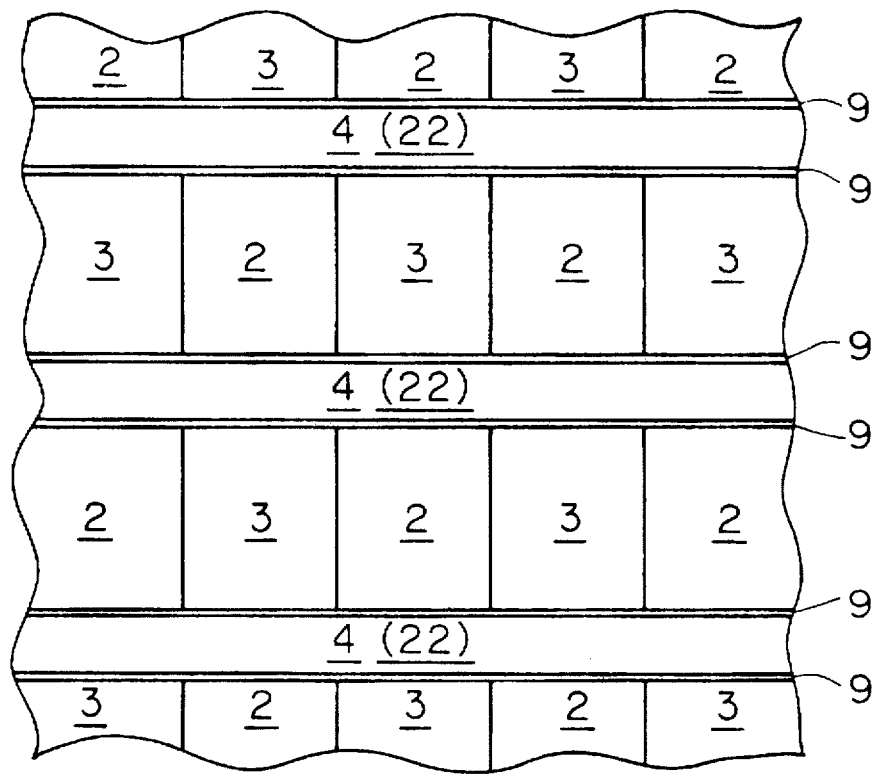
Figure 28:
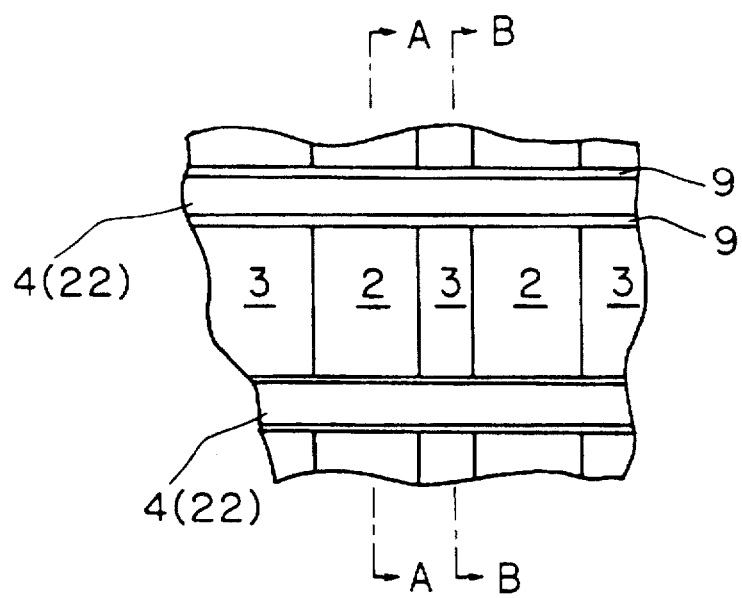
Figure 29:
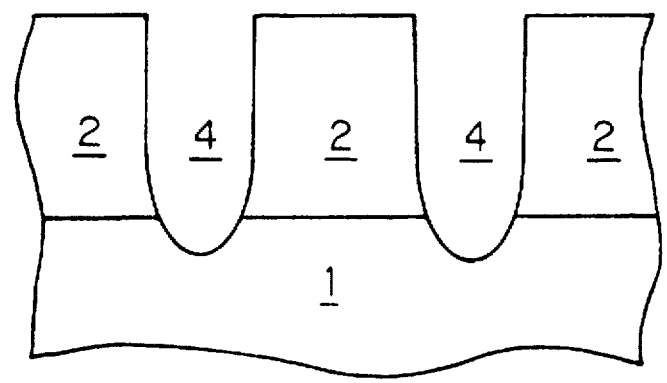
FIGS. 29 to 33 are cross-sectional views of devices to which the first to third preferred embodiments are applied.
Figure 30:
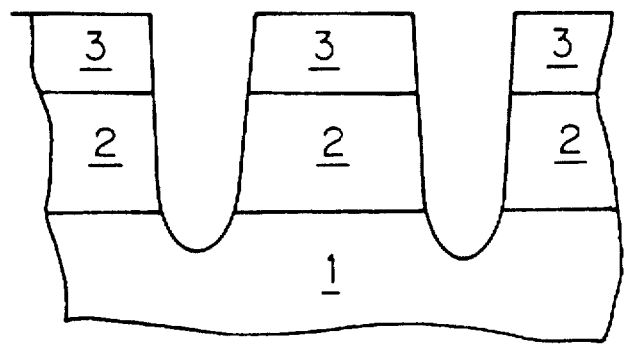

FIG. 28 illustrates a part of FIG. 26. FIGS. 29 and 30 are cross-sectional views taken along the lines A—A and B—B of FIG. 28. FIGS. 29 and 30 differ in construction from FIG. 22.

Figure 31:
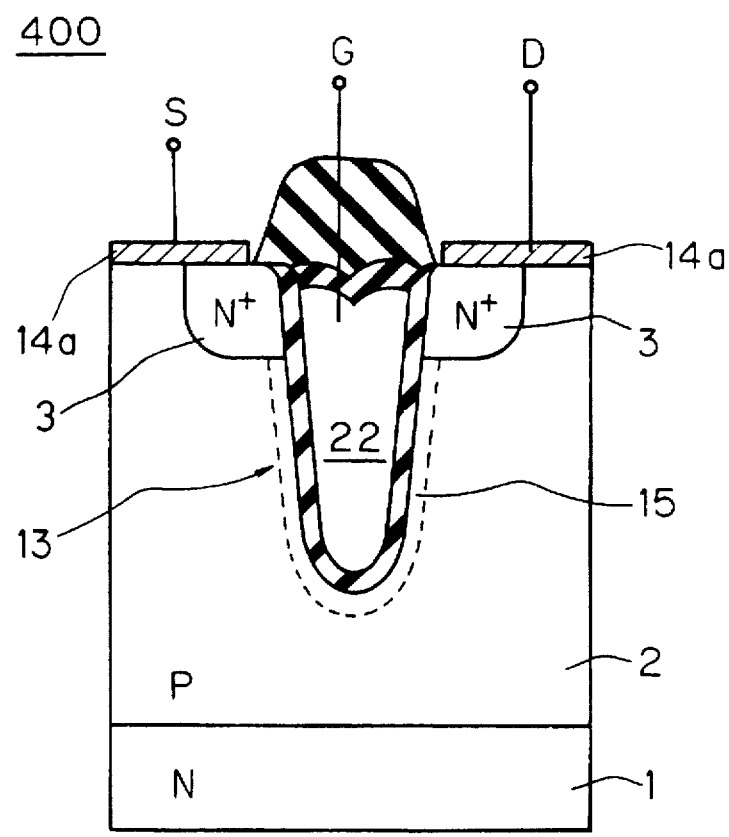

FIG. 31 is a cross-sectional view of a lateral trench gate type MOSFET 400 having the trench MOS gate portion 13. The lateral trench gate type MOSFET 400 differs from the trench gate type MOSFET 200 of FIG. 22 in that the $N^+$ layer 1b and the drain electrode 14c are not formed and that one of the electrodes 14a serves as a source electrode and the other as a drain electrode.

Figure 32:
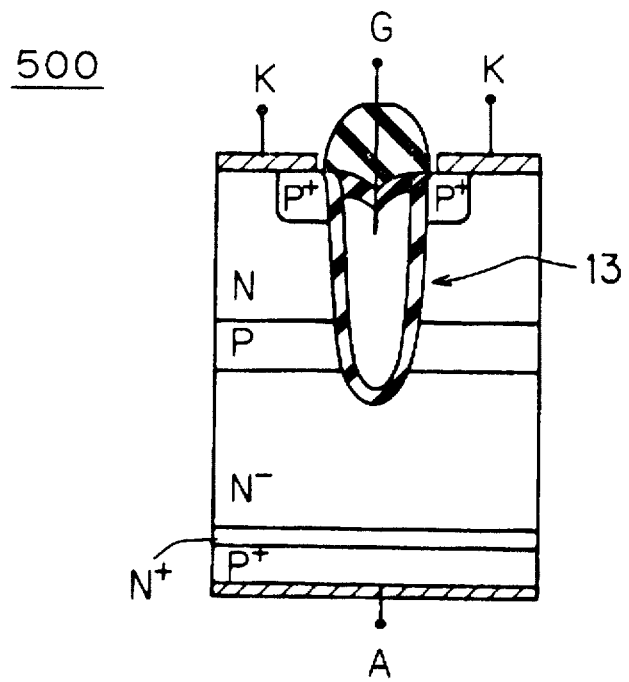

The lateral trench gate type MOSFET which is provided by applying the trench gate structure to a lateral MOSFET has the channel 15 longer than that of the conventional lateral MOSFET to prevent a short-channel effect due to size reduction. FIG. 32 is a cross-sectional view of a trench type MCT (MOS controlled thyristor) 500.

The fabrication method of the first to third preferred embodiments may be applied to the trench MOS gate portions 13 of these devices. Since the damages to and contamination on the inner wall of the trench 4 which are produced by anisotropic etching are removed, the carrier mobility in the channel is improved. This reduces the channel resistance in the on state to reduce the on-state resistance of the whole device.

Figure 33:
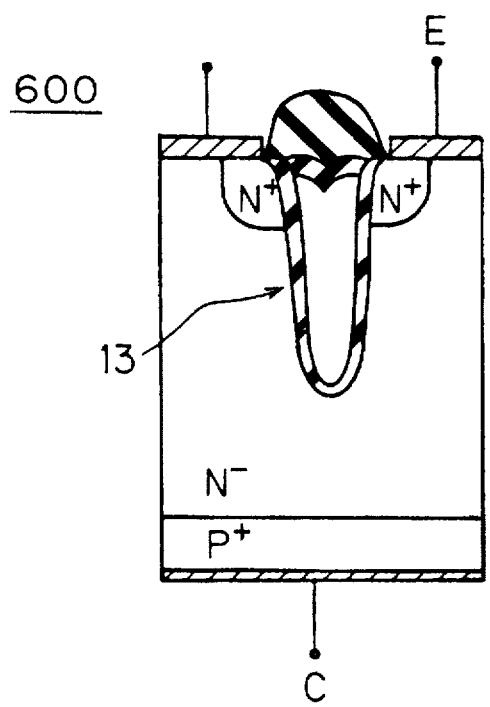

FIG. 33 is a cross-sectional view of a trench type diode 600. In such a structure, a positive potential is not applied to the gate electrode 22 in the on state but a negative potential is applied thereto in the off state. The use of the trench MOS gate portion 13 formed by the fabrication method of the first to third preferred embodiments avoids the electric field concentration.

D. Third Fabrication Method

The third fabrication method is a technique for forming the sacrificial oxide film twice.

(d-1) Fourth Preferred Embodiment

Figure 34:
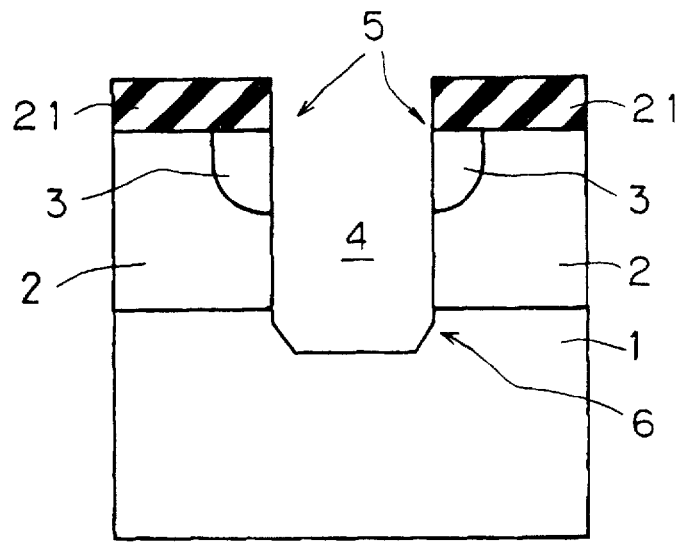
FIGS. 34 to 43 are cross-sectional views showing a fourth preferred embodiment in step-by-step fashion according to the present invention.

FIGS. 34 to 43 are cross-sectional views showing a process for forming a trench MOS gate portion in step-by-step fashion according to a fourth preferred embodiment of the present invention. The doped P type region 2 and the heavily doped N type region 3 are formed on the substrate 1, and the oxide film 21 is formed on top of the regions 2 and 3 in the same manner as the background art. An opening is cut selectively in the oxide film 21 on the heavily doped N type region 3. The trench 4 extending through the doped P type region 2 and the heavily doped N type region 3 is formed by anisotropic etching (FIG. 34). At this point of time, the opening portion and bottom of the trench 4 are of angular configurations 5 and 6, respectively.

Figure 35:
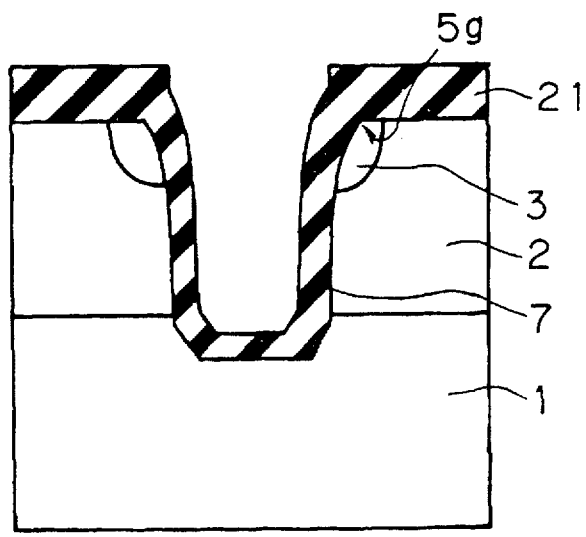
Figure 36:
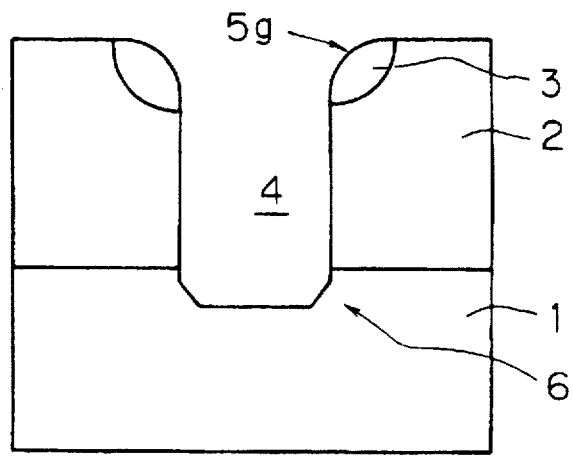

Referring to FIG. 35, the silicon oxide film 7 is formed in the trench 4 in an atmosphere of oxygen at a relatively high temperature $T_H$. The temperature $T_H$ is not less than 1000° C., for example 1100° C. The atmosphere used herein is, for example, an atmosphere of 100% oxygen. Since a soft oxide film is formed at an temperature of 1000° C. or more, the opening portion of the trench 4 has a rounded configuration as designated at 5g. The silicon oxide films 7 and 21 are removed by etching (FIG. 36).

Figure 37:
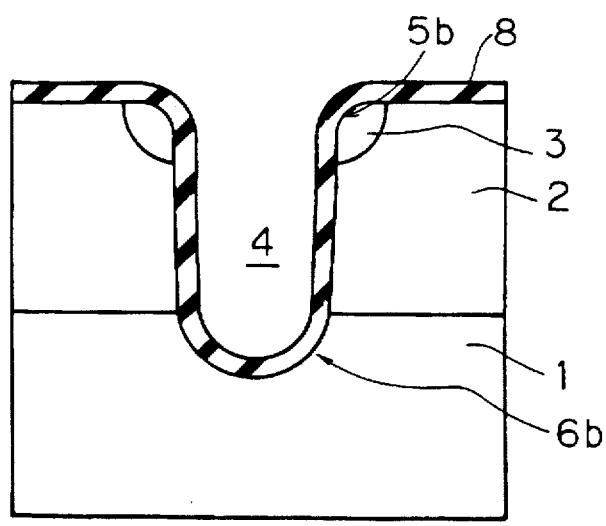

Further, a silicon oxide film 8 is formed in the trench 4 in an atmosphere of steam (FIG. 37). Formation of the silicon oxide film 8 under such conditions provides a rounded configuration 6b of the bottom of the trench 4 and a further rounded configuration 5b of the opening portion of the trench 4. A temperature $T_L$ used at this time is lower than the temperature $T_H$ and is, for example, 950° C.

In general, when the present invention is applied to the trench 4 having an aspect ratio, or the ratio of depth to opening size, of from 2 to 30, the thickness of the silicon oxide films 7, 8 may be selected to be on the order of one-twentieth to one-fifth the opening size. That is, the thickness of the silicon oxide films 7, 8 to be formed relative to the trench 4 of 1 μm in width is selected to be on the order of 50 to 200 nm, for example 100 nm.

Figure 38:
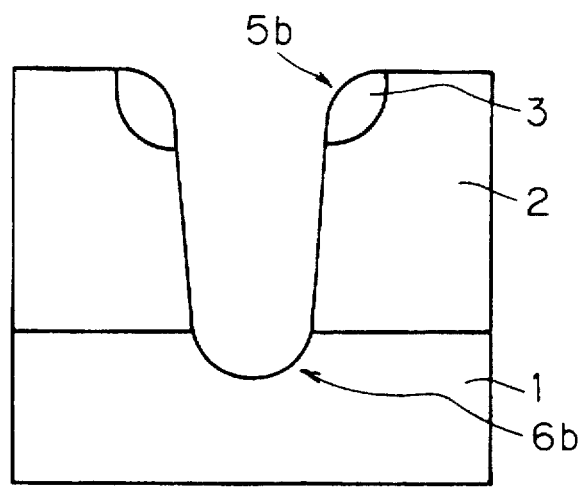

Referring to FIG. 38, the silicon oxide film 8 is removed by etching. The two processes of forming and removing the silicon oxide films 7, 8 under the above-mentioned conditions allow the trench 4 to have the opening portion and bottom of rounded configurations as designated at 5b and 6b.

Figure 39:
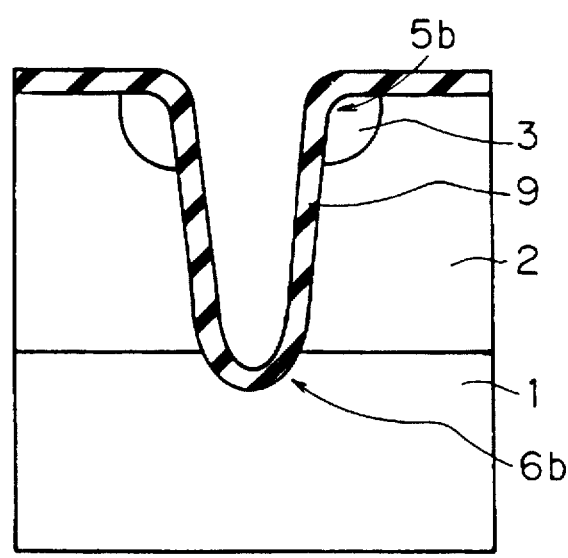

A silicon oxide film is formed in the trench 4 as the gate oxide film 9 (FIG. 39). The rounded configurations of the opening portion and bottom of the trench 4 prevent a phenomenon in which the gate oxide film 9 is partially thin as having occurred in the background art and allow the gate oxide film 9 to be formed uniformly in the trench 4.

Figure 40:
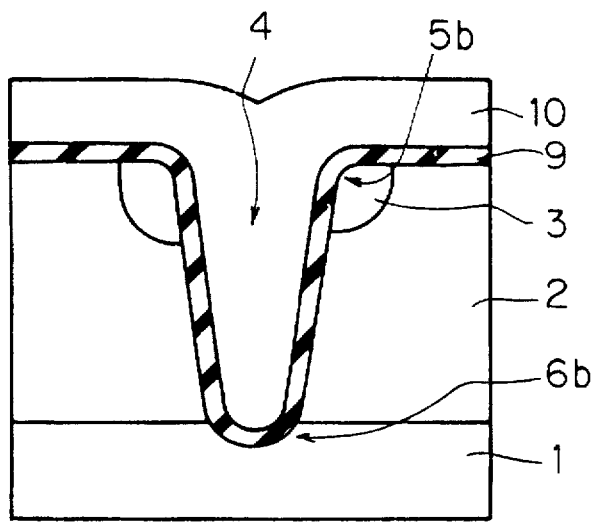
Figure 41:
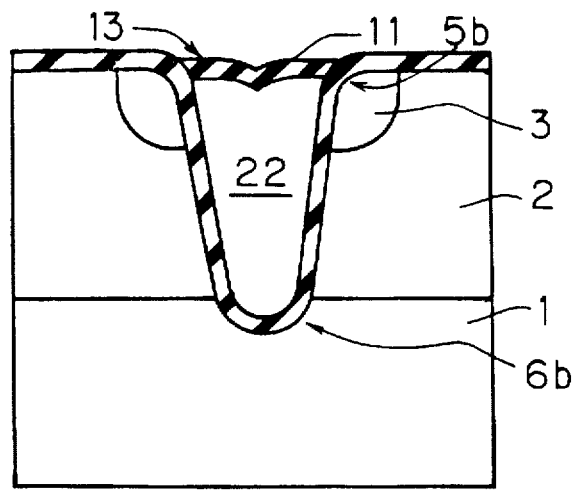
Figure 42:
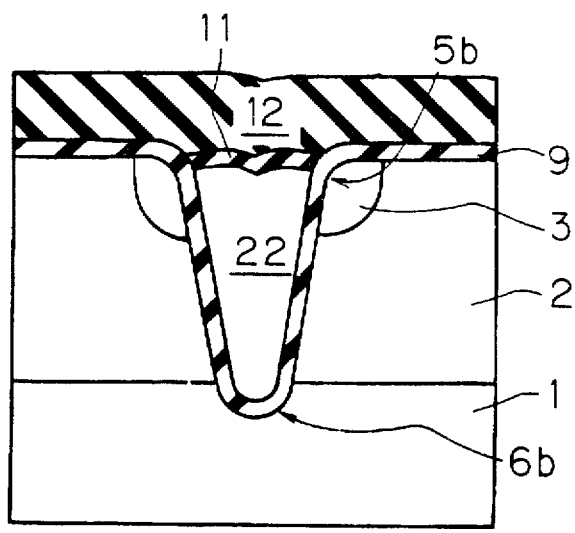
Figure 43:
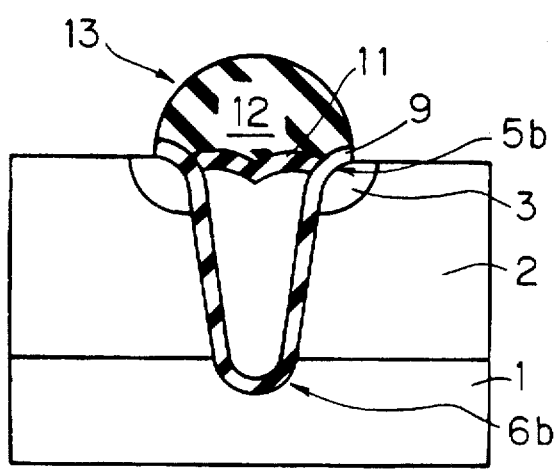

Then, low-resistance polycrystalline silicon 10 is deposited on top of the structure provided through the foregoing steps, and the trench 4 is filled with the low-resistance polycrystalline silicon 10 through the gate oxide film 9 (FIG. 40). The low-resistance polycrystalline silicon 10 is selectively left by etching technique to form the gate electrode 22 made of the low-resistance polycrystalline silicon 10 in the trench 4. Further, the silicon oxide film 11 is formed on the gate electrode 22 (FIG. 41), and the oxide film 12 is deposited over the top surface by CVD process, for example (FIG. 42). The oxide film 12 is selectively left by etching to form the trench MOS gate portion 13 (FIG. 43).

In the trench MOS gate portion 13 formed in the foregoing manner, since the phenomenon is prevented in which the gate oxide film 9 is thin in the opening portion and bottom of the trench 4, electric field concentration in these portions is also avoided if a gate voltage is applied to the gate electrode 22. This suppresses the leak current of the gate oxide film 9 and avoids gate breakdown.

Provision of good MOS gate characteristics necessitates complicated process steps. However, by the first sacrificial oxide film formation at the temperature $T_H$ of 1000° C. or more, defects of semiconductor (the substrate 1, the doped P type region 2, and the heavily doped N type region 3) about the trench 4 resulting from the formation of the trench 4 by anisotropic etching are reduced by the annealing effect and are subjected to the gettering effect into the vicinity of the inside of the trench 4.

By the subsequent second sacrificial oxide film formation at the temperature $T_L$ lower than the temperature $T_H$, the defects subjected to the gettering effect into the vicinity of the inner wall of the trench 4 are drawn into the silicon oxide film 8. Thus, the defects of the semiconductor about the trench 4 are reduced as compared with the background art.

The defect reduction can improve the mobility of carriers in channels to be formed in the semiconductor about the trench 4 when a predetermined potential is applied to the gate electrode 22.

The on-state voltage is improved by applying the fabrication method of the fourth preferred embodiment to the formation of the trench MOS gate portion 13 of the trench gate type IGBT 300 of FIG. 23.

Figure 44:
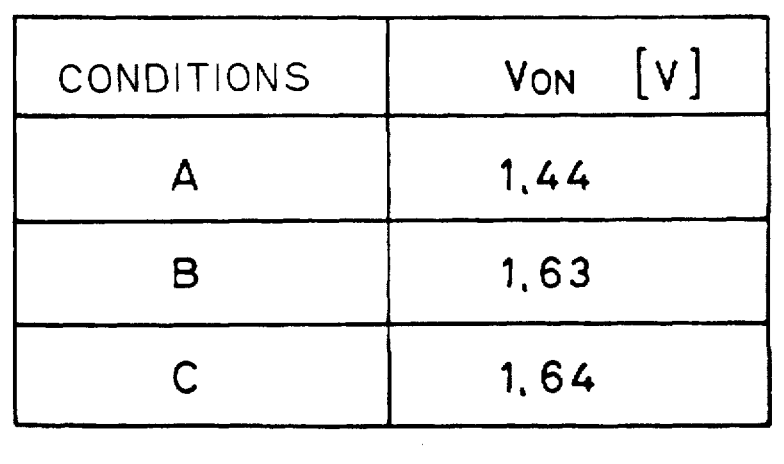

FIG. 44 illustrates an on state voltage which is a basic characteristic of the trench gate type IGBT. Under the condition A of FIG. 44, the on state voltage of the trench gate type IGBT 100 is provided by the application of the present invention, and it is 1.44 V. Under the condition B of FIG. 44, the on state voltage of the trench gate type IGBT having the trench MOS gate portion is provided by interchanging the first and second sacrificial oxidation conditions, and it is 1.63 V. Under the condition C of FIG. 44, the on state voltage of the trench gate type IGBT having the trench MOS gate portion is provided by the conventional fabrication method, and it is 1.64 V. It should be noted that a turn-off time is constant (200 ns) under the respective conditions.

It will be apparent from FIG. 44 that the method of forming the trench MOS gate portion of the fourth preferred embodiment can reduce the on-state voltage of the trench gate type IGBT. This significantly improves power loss.

The trench 4 has the rounded configuration, and contamination of the substrate 1 on the trench inner wall, defects adjacent the trench, and residual stress are reduced. This improves the interface state and carrier mobility in the channel regions 15 to enhance the characteristics of the trench MOS gate. The result is a reduction in on state voltage which is a basic characteristics of power devices, an improved switching characteristic and, accordingly, a reduction in power loss.

The fabrication method of the fourth preferred embodiment may be applied to the trench gate type MOSFETs 100, 200 of FIGS. 21, 22, the lateral trench gate type MOSFET 400 of FIG. 31, and the trench type MCT 500 of FIG. 32. The application of the fourth preferred embodiment to such power devices represents an improvement which is an increased electron mobility in the channel region 15.

The fourth preferred embodiment may be also applied to the trench type diode 600 of FIG. 33.

(d-2) Fifth Preferred Embodiment

The thickness of the silicon oxide film 7 formed by the first sacrificial oxidation is selected to be on the order of one-twentieth to one-fifth the opening size of the trench 4 in the fourth preferred embodiment. Selection of the thickness which is not less than one-tenth the opening size affords a further rounded configuration of the opening portion of the trench 4 to improve the breakdown voltage of the gate oxide film 9 without the second sacrificial oxidation and silicon oxide film 8. Thus, the process steps are simplified.

It is, however, desirable that the thickness of the silicon oxide film 7 is selected to be not more than three-tenths the opening size of the trench 4 so that the trench 4 is filled up and the bottom of the trench 4 is not warped.

(d-3) Selection of Material

The semiconductor substrate 1 may be made up of a semiconductor compound such as $SiC_x$ (0<x<1), $SiGe_y$ (0<y<1) or the like, thereby providing further advantages.

When $SiC_x$ is used as a substrate, the substrate may be used at a high temperature because of its great band gap, and a device for a high breakdown voltage is reduced in thickness. The use of $SiGe_y$ permits a high-speed operation of the device because of its small band gap and great mobility.

E. Fourth Fabrication Method

The fourth fabrication method is a technique for trench isolation in the SOI structure.

(e-1) Sixth Preferred Embodiment

A sixth preferred embodiment provides a technique for forming an oxide film on the trench inner wall in an atmosphere of oxygen at a temperature not less than 1000° C., like the first preferred embodiment.

Figure 73:
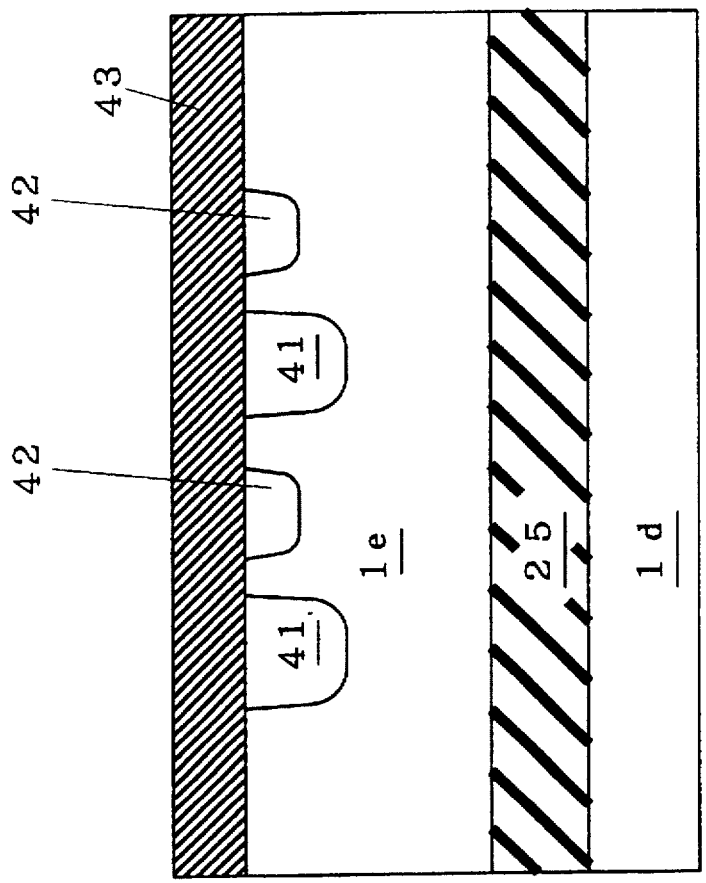
FIGS. 73 to 81 are cross-sectional views showing second prior art in step-by-step fashion.
Figure 74:
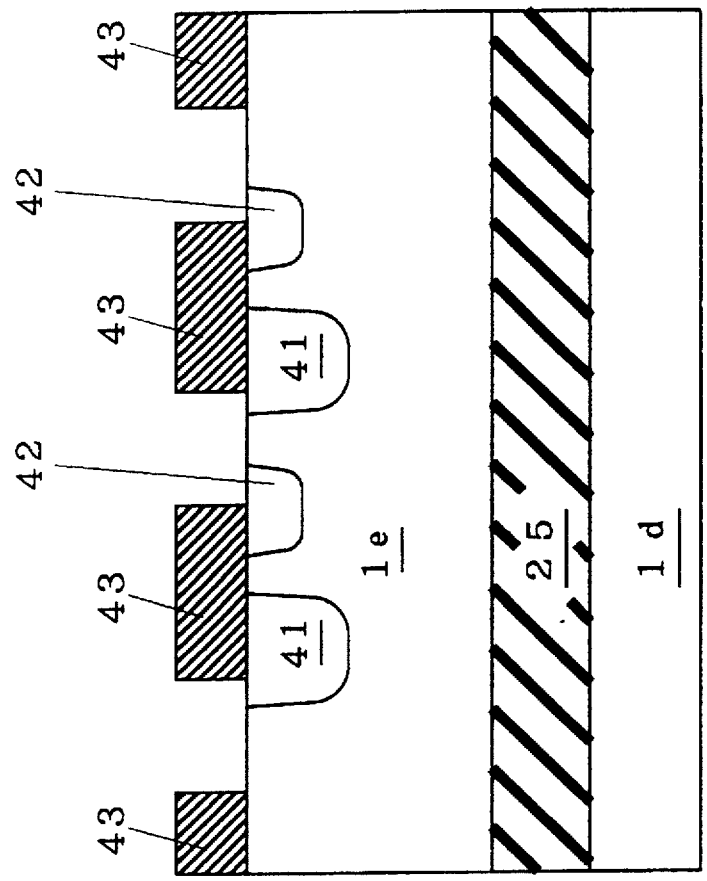
Figure 75:
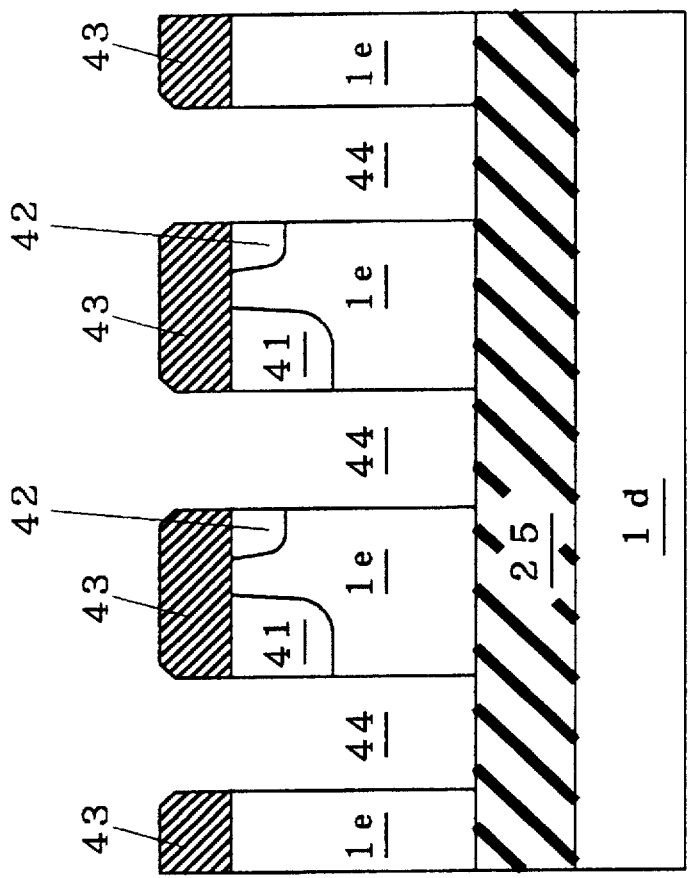

The sixth preferred embodiment will be discussed below in contrast to the second background art. Like the second background art, substrates 1e and 1d made of silicon and the like are bonded together, with a silicon oxide film 25 therebetween. P layers 41 and N⁺ layers 42 are selectively formed in an upper portion of the semiconductor substrate 1e. A silicon oxide film 43 is formed over the semiconductor substrate 1e (FIG. 73). The silicon oxide film 43 is selectively removed so that parts of the P layers 41 and N⁺ layers 42 are exposed (FIG. 74), and silicon etching is performed using the remaining silicon oxide film 43 as a mask. This permits the semiconductor substrate 1e to be selectively excavated down to form trenches 44 (FIG. 75).

Figure 76:
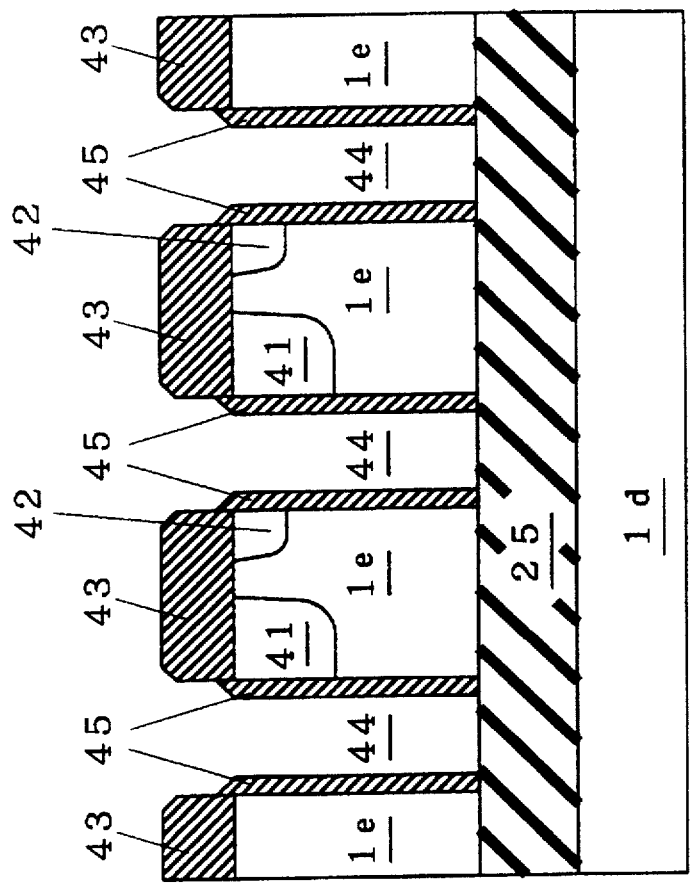
Figure 77:
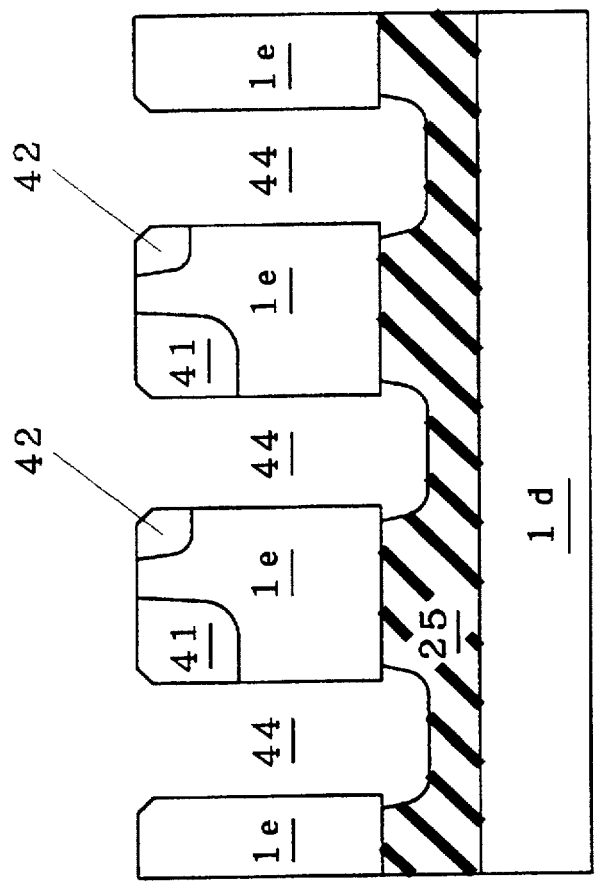

Then, sacrificial oxide films 45 are once formed on inner walls of the trenches 44 by thermal oxidation (FIG. 76), and the silicon oxide films are etched. This permits the removal of parts of the silicon oxide film 25, all of the sacrificial oxide films 45 and all of the silicon oxide film 43, and also permits the trenches 44 to be further excavated down to the level lower than the bottom of the semiconductor substrate 1e (FIG. 77).

Figure 45:
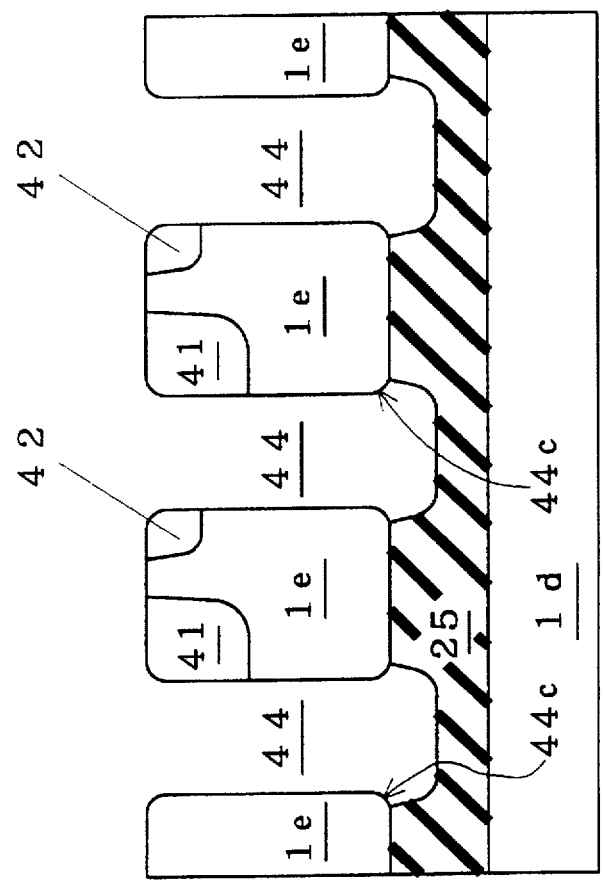
FIGS. 45 and 46 are cross-sectional views showing a sixth preferred embodiment in step-by-step fashion according to the present invention.
Figure 78:
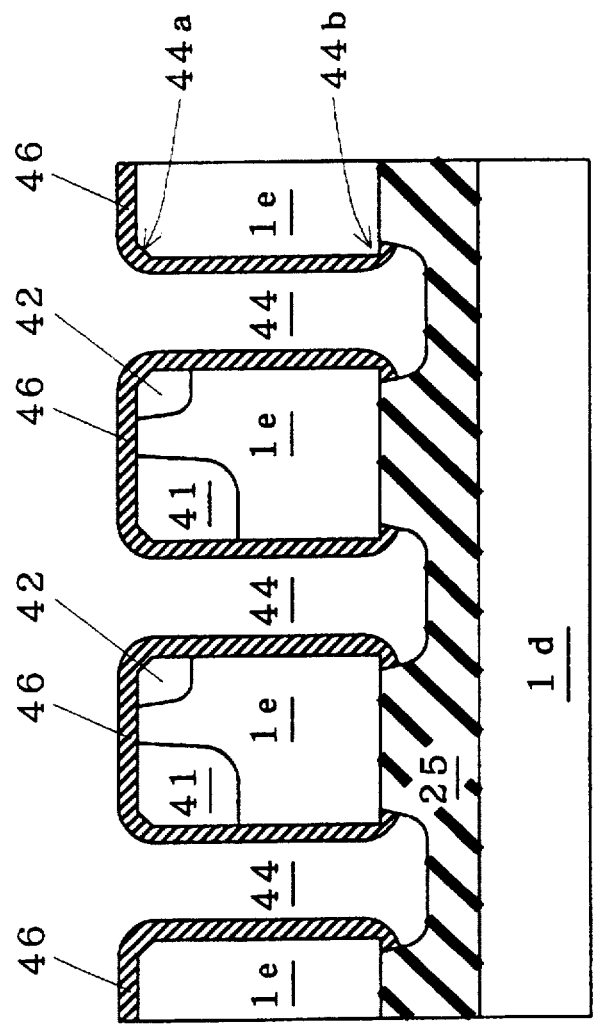
Figure 79:
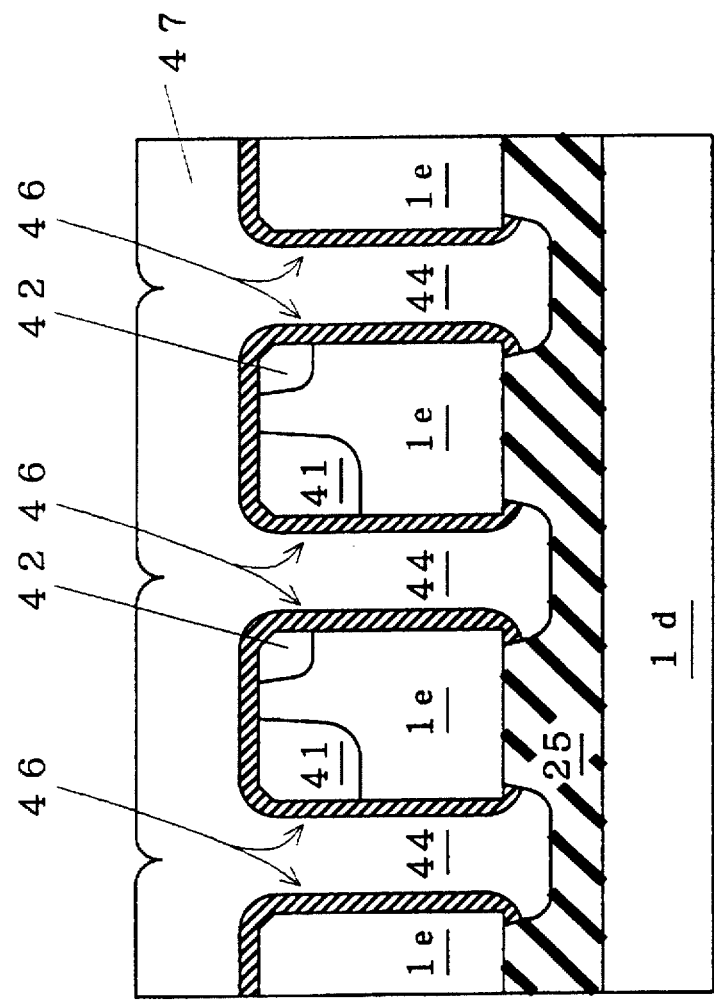
Figure 80:
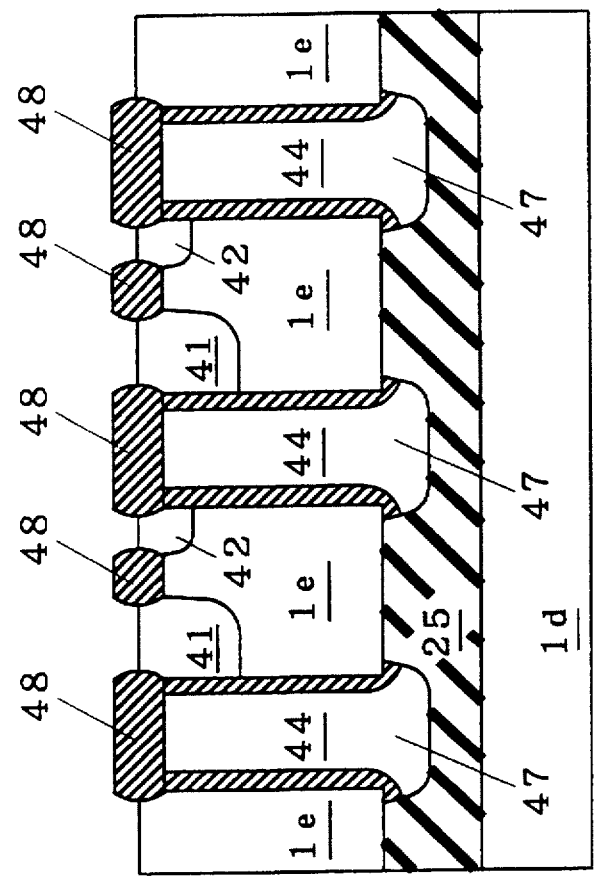
Figure 81:
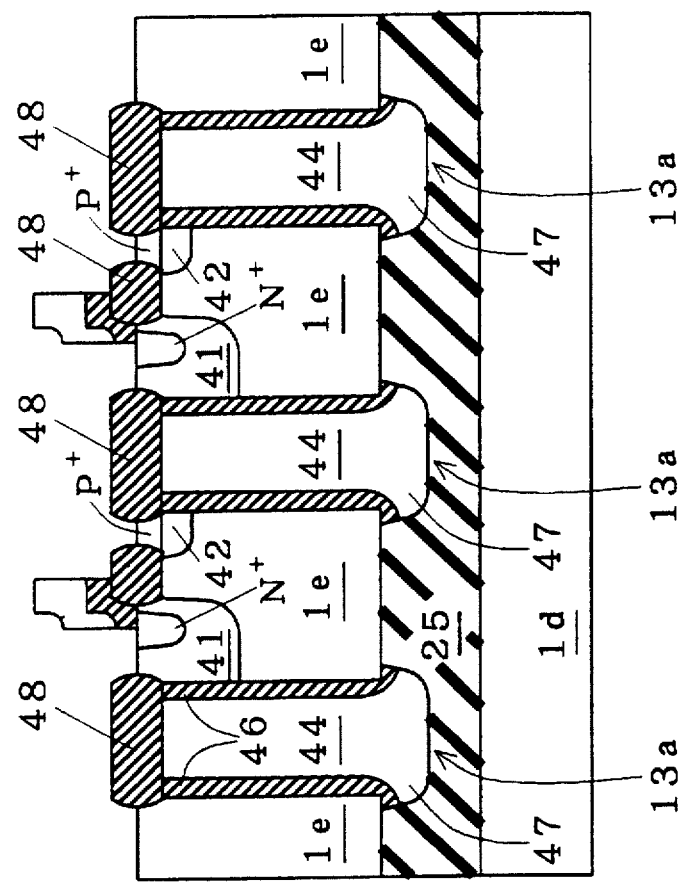

The above described process steps of the sixth preferred embodiment are similar to those of the second background art. Thermal oxidation in an atmosphere of oxygen at a temperature not less than 1000° C. provides isolation oxide films 46 around the remaining semiconductor substrate 1e (including the P layers 41 and N⁺ layers 42). FIG. 45 is a cross-sectional view of the structure provided in the above described process steps in the sixth preferred embodiment. In this manner, the corners of the semiconductor substrate 1e are rounded by the formation of the isolation oxide films 46 like the first preferred embodiment. For example, bottoms 44c of the trenches 44 are more rounded than the bottoms 44b of FIG. 78.

Figure 46:
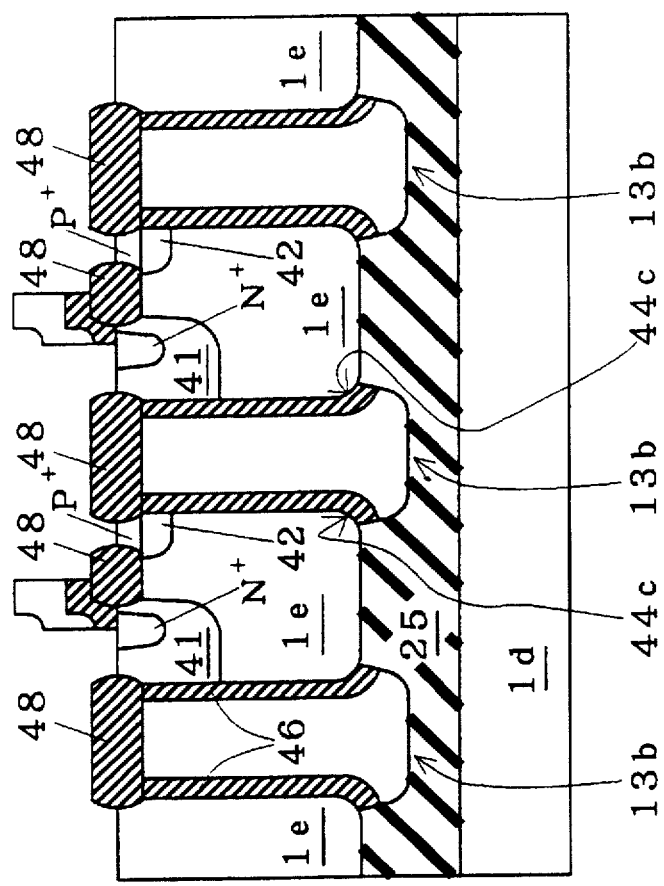

Then the process steps similar to those of the second background art (that is, the steps of filling the trenches 44 with polycrystalline silicon 47, covering the polycrystalline silicon 47 with field oxide films 48, and forming a predetermined doped layer) proceed, and lateral IGBTs are formed. FIG. 46 is a cross-sectional view of the lateral IGBTs fabricated in this manner.

With the lateral IGBTs thus constructed, isolating portions 13b having a trench structure include the isolation oxide films 46 which are not locally thin as compared with the isolating portions 13a of the second background art. This solves the problem of the decrease in isolation breakdown voltage.

(e-2) Seventh Preferred Embodiment

FIGS. 47 to 55 are cross-sectional views illustrating a method of fabricating a semiconductor device in step-by-step fashion according to a seventh preferred embodiment of the present invention.

Figure 47:
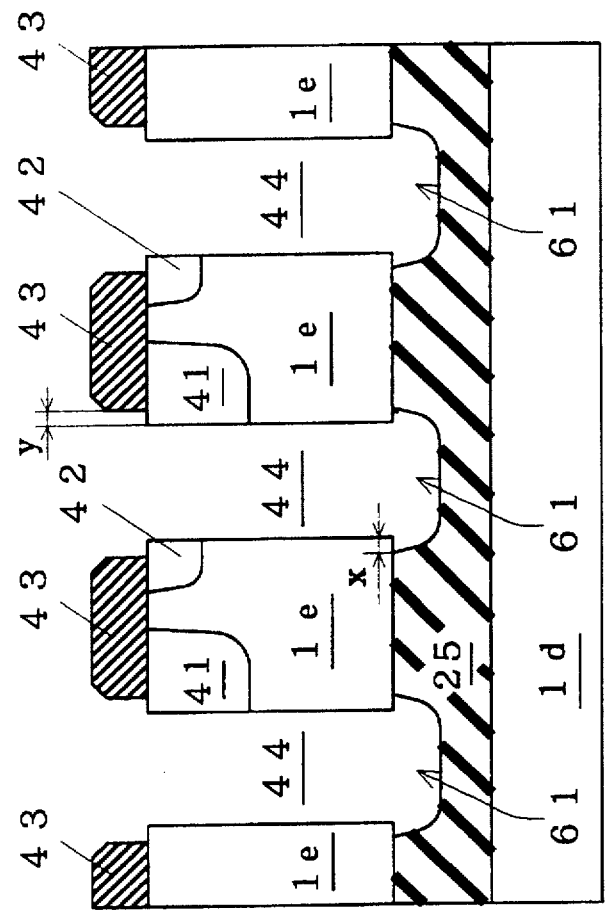
FIGS. 47 to 55 are cross-sectional views showing a seventh preferred embodiment in step-by-step fashion according to the present invention.

The structure of FIG. 75 is initially obtained in the same manner as the second background art. Isotropic etching is performed on the silicon oxide films to laterally etch and back away the silicon oxide films 43 serving as a trench etching mask and to form recesses 61 in the silicon oxide film 25 under the trenches 44. The corners of the substrate 1e are exposed a distance x in the recesses 61 (FIG. 47).

Figure 48:
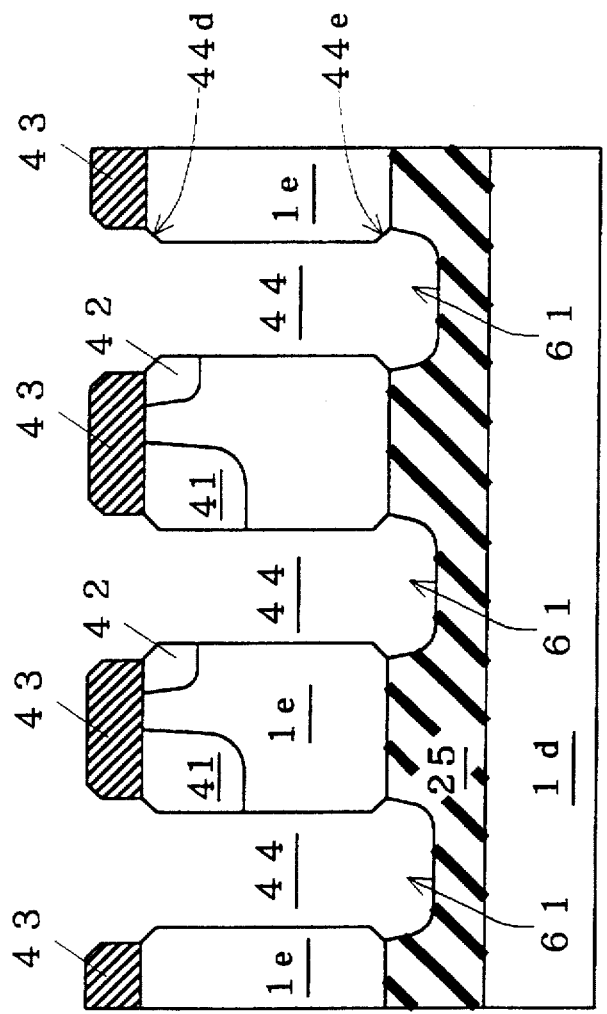
Figure 49:
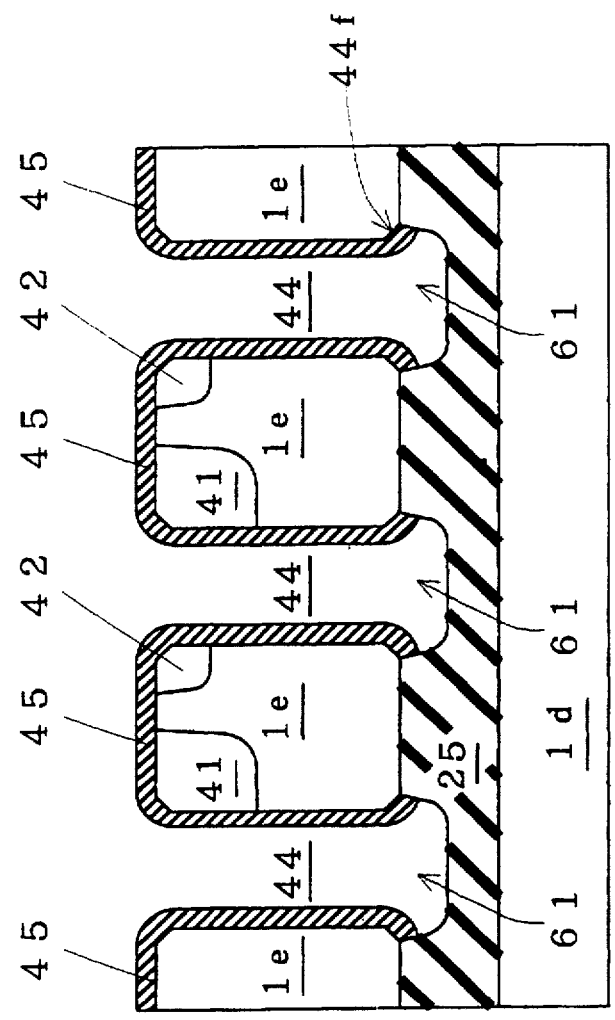

Then isotropic silicon etching is performed to round the corners of the substrate 1e exposed in the recesses 61 and chamfer bottoms 44e of the trenches 44. The oxide-based films deposited by the isotropic silicon etching are removed (FIG. 48). Like the second preferred embodiment, the distance x is preferably 100 to 400 nm. The etching gas is an $O_2/CF_4$ based gas, and the ratio R preferably satisfies 1<R<5.

Figure 50:
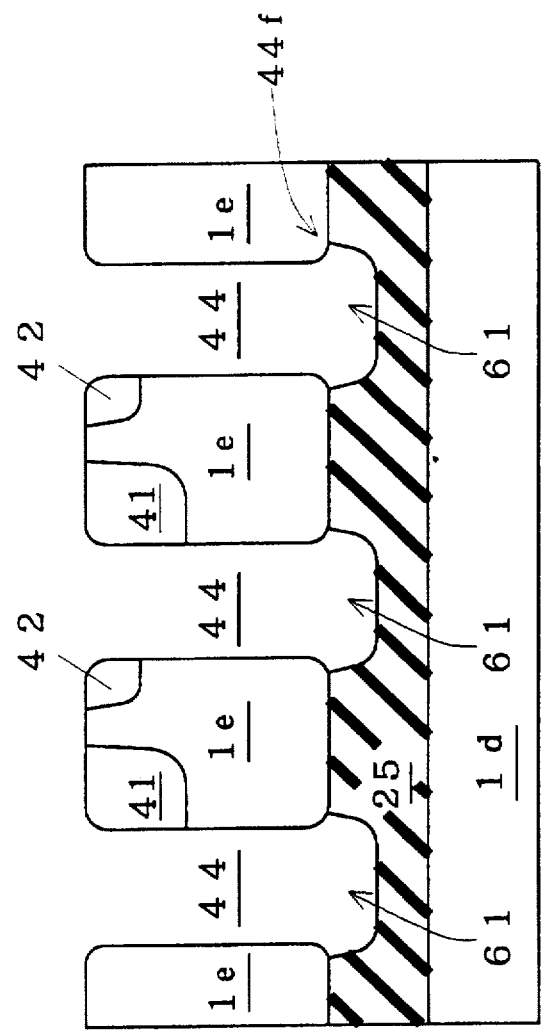

Then, the sacrificial oxide films 45 are once formed on the inner walls of the trenches 44 by thermal oxidation (FIG. 49), and the silicon oxide films are etched. This permits the removal of all of the sacrificial oxide films 45 and silicon oxide film 43 and also permits bottoms 44f of the trenches 44 to be further rounded (FIG. 50). Thermal oxidation in an atmosphere of steam at a temperature not more than 1000° C. provides the isolation oxide films 46 around the remaining semiconductor substrate 1e (including the P layers 41 and N⁺ layers 42) (FIG. 51).

Figure 51:
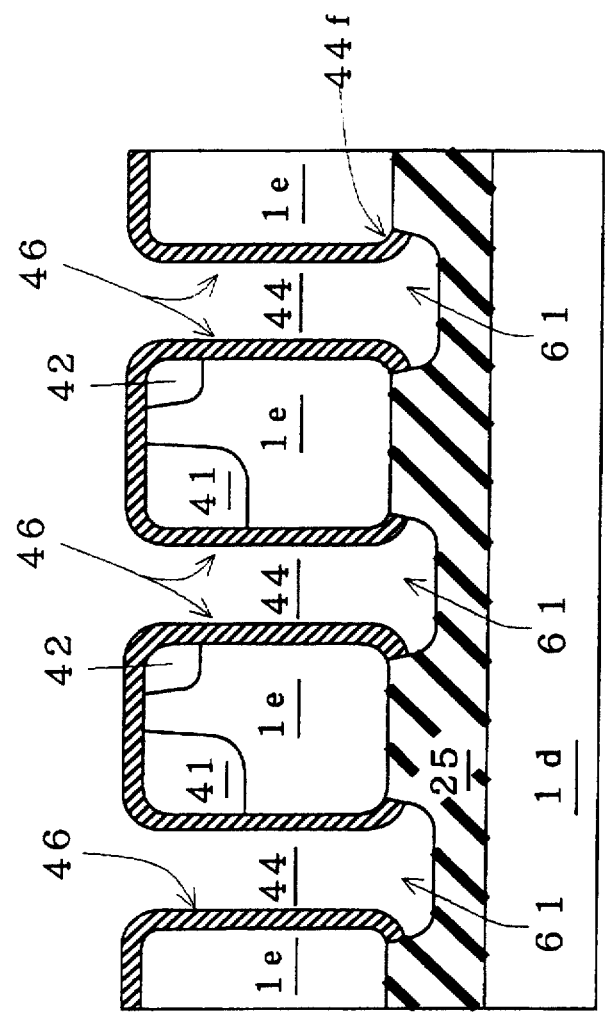
Figure 52:
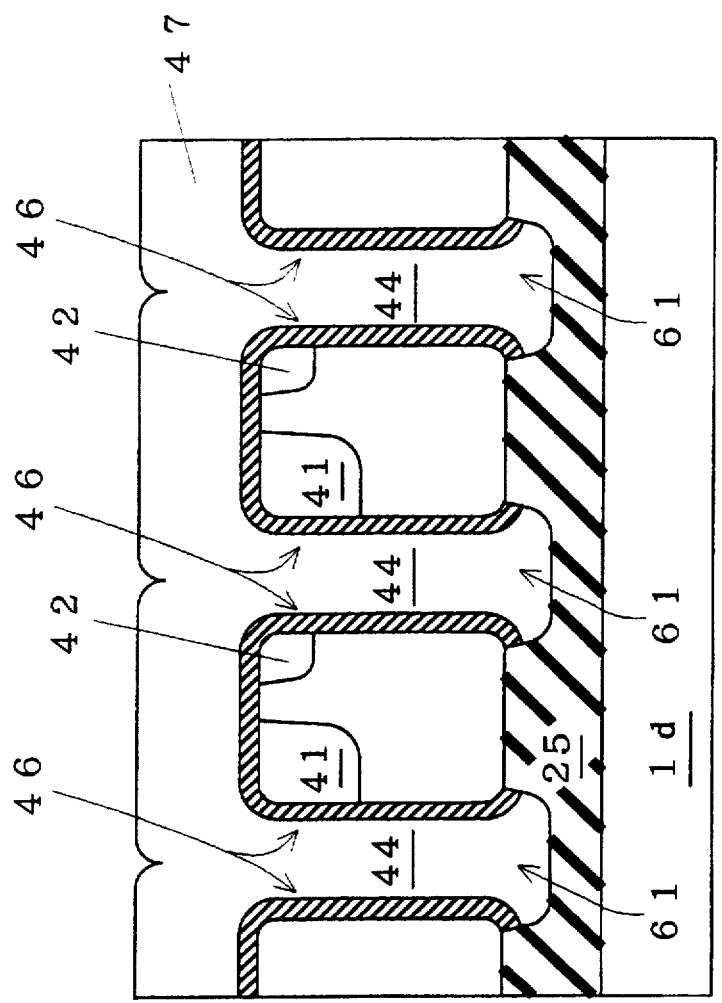
Figure 53:
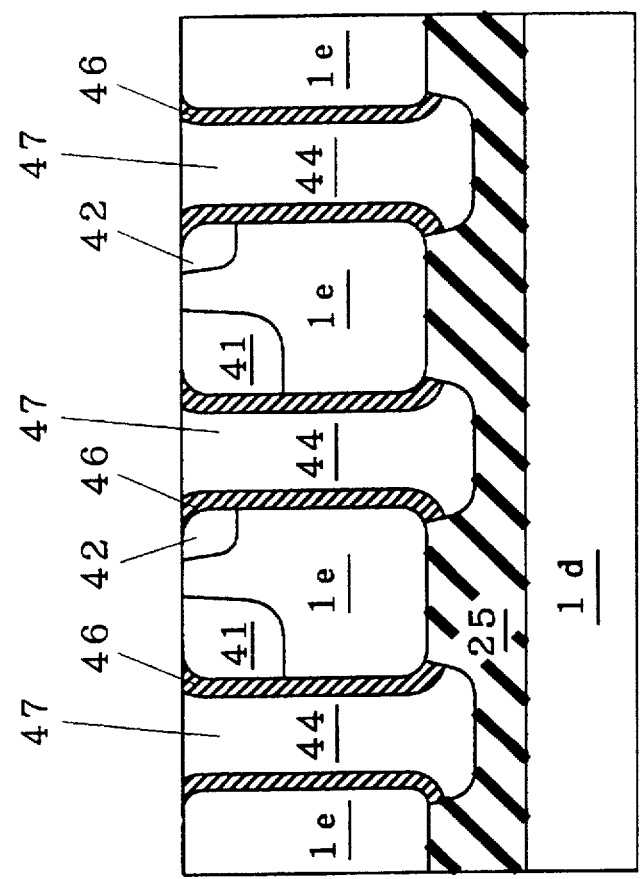
Figure 54:
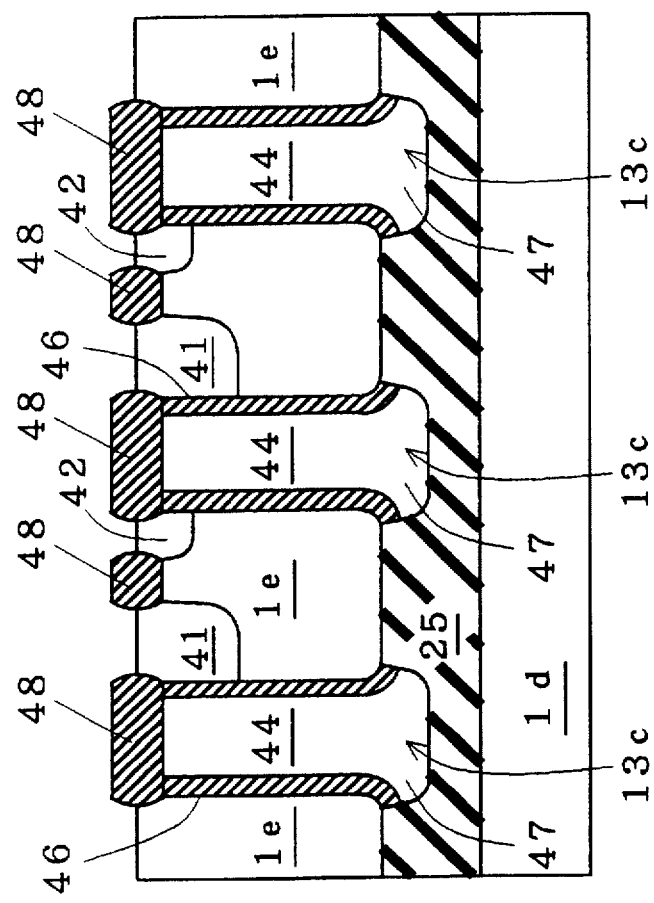
Figure 55:
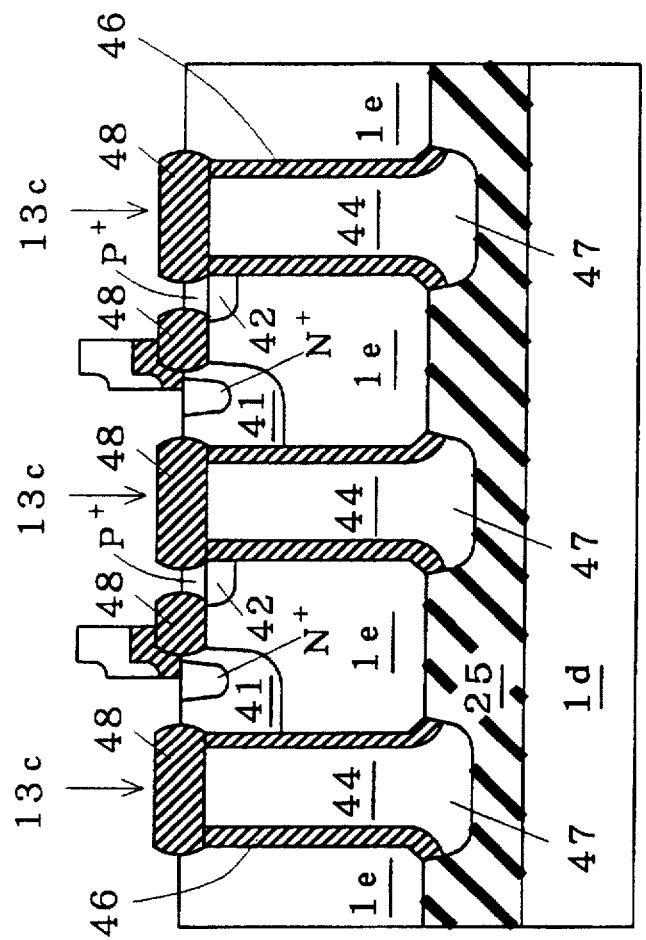

The polycrystalline silicon 47 is deposited over the structure of FIG. 51 to fill the trenches 44 (including the recesses 61) with the polycrystalline silicon 47 (FIG. 52). The polycrystalline silicon 47 over the semiconductor substrate 1e is selectively removed so that the polycrystalline silicon 47 remains only in the trenches 44 (FIG. 53). The polycrystalline silicon 47 is covered with the field oxide films 48. The field oxide films 48 are also formed on the surface of the semiconductor substrate 1e between the P layers 41 and the N⁺ layers 42 (FIG. 54). Then a predetermined doped layer is formed, and the lateral IGBTs are formed which are isolated from each other by isolating portions 13c having a trench structure (FIG. 55).

In the isolating potions 13c formed in this manner, the isolation oxide films 46 are not locally thin. This solves the problem of the decrease in isolation breakdown voltage.

When the silicon oxide films are etched in FIG. 47, the silicon oxide film 43 may back away a distance y from the opening portion of the trenches 44. If the silicon oxide film 43 is sufficiently thick relative to the distance x, the silicon oxide film 43 need not be covered with a resist. As a result, since the distance y is generally equal to the distance x if the P layers 41 and the N⁺ layers 42 are exposed the distance y around the trenches 44, opening portions 44d of the trenches 44 are also rounded by the isotropic silicon etching. This is a secondary preferable effect of the present invention. However, the opening portions 44d are subsequently covered with the filed oxide films 48, and the effect of the present invention is not prevented.

The isolation oxide films 46 are prevented from becoming locally thin as compared with the second background art since the bottoms 44e of the trenches 44 are chamfered if the process steps of forming and removing the sacrificial oxide films 45 like the third preferred embodiment.

(e-3) Eighth Preferred Embodiment

FIGS. 56 to 61 are cross-sectional views illustrating a method of fabricating a semiconductor device in step-by-step fashion according to an eighth preferred embodiment of the present invention.

Figure 56:
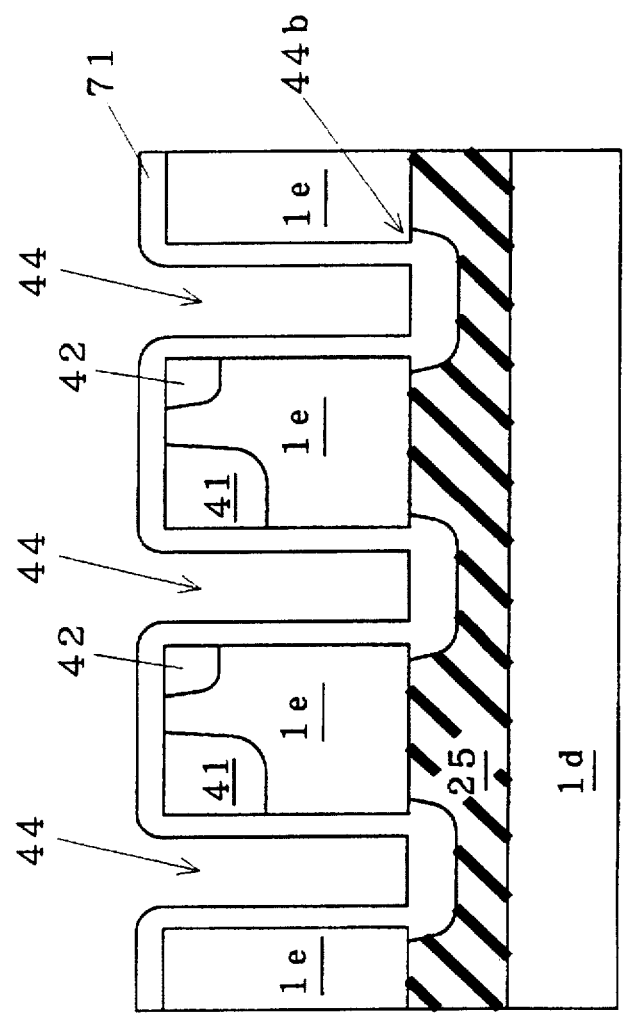
FIGS. 56 to 61 are cross-sectional views showing an eighth preferred embodiment in step-by-step fashion according to the present invention.

The structure of FIG. 77 is initially obtained in the same manner as the second background art. The silicon oxide film 25 is etched to a depth of about 200 to 300 nm, for example, to form the extending trenches 44. Polycrystalline silicon 71 is deposited to a thickness of 200 to 300 nm over the top surface. Then, the polycrystalline silicon 71 is exposed on the inner surfaces of the trenches 44 (FIG. 56). In general, polycrystalline silicon has a good step coverage and covers the corners of the trenches 44 if the corners of the substrate 1e are projecting in the bottoms 44b of the trenches 44.

Figure 57:
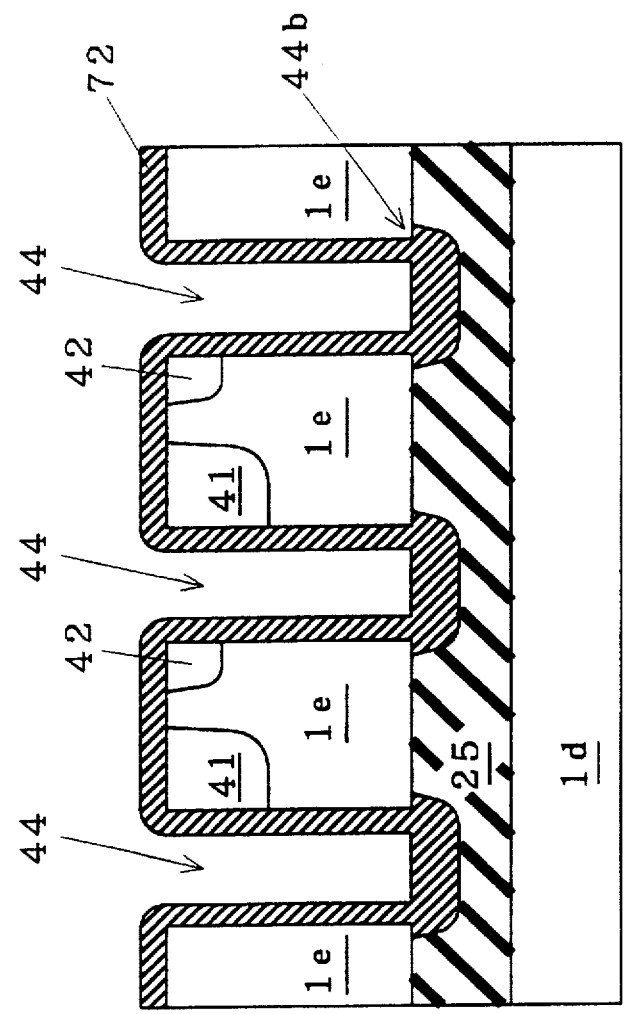

Thermal oxidation is performed at a temperature ranging from 800° to 1250° C. to form a silicon oxide film 72 from the polycrystalline silicon 71 (FIG. 57). Consequently, the silicon oxide film 72 serving as an isolation oxide film has a thickness of 200 to 300 nm and is not locally thin.

Figure 58:
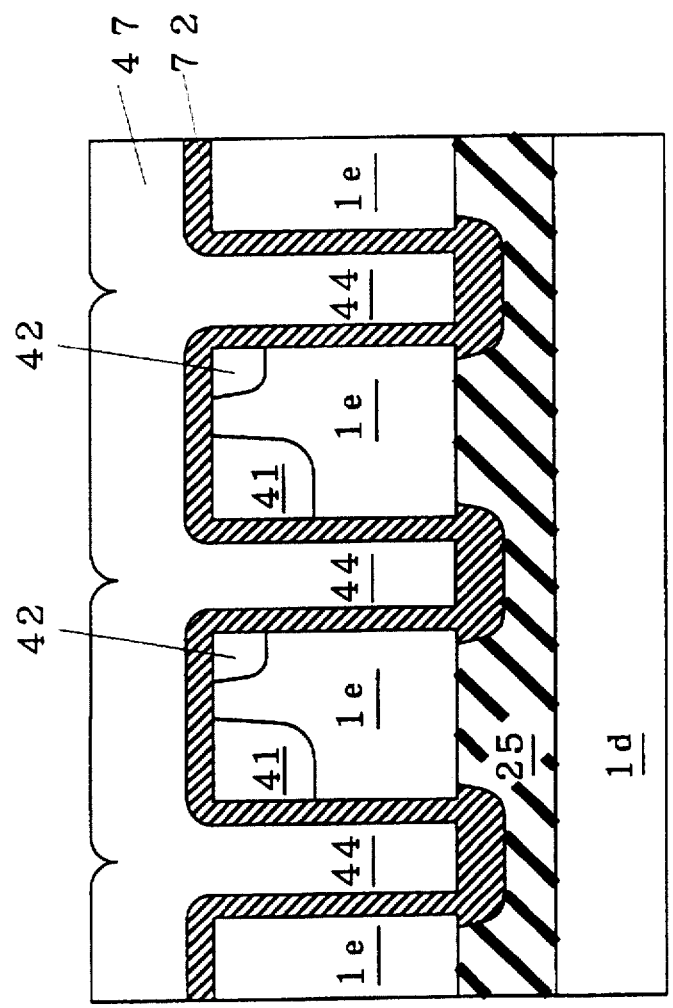
Figure 59:
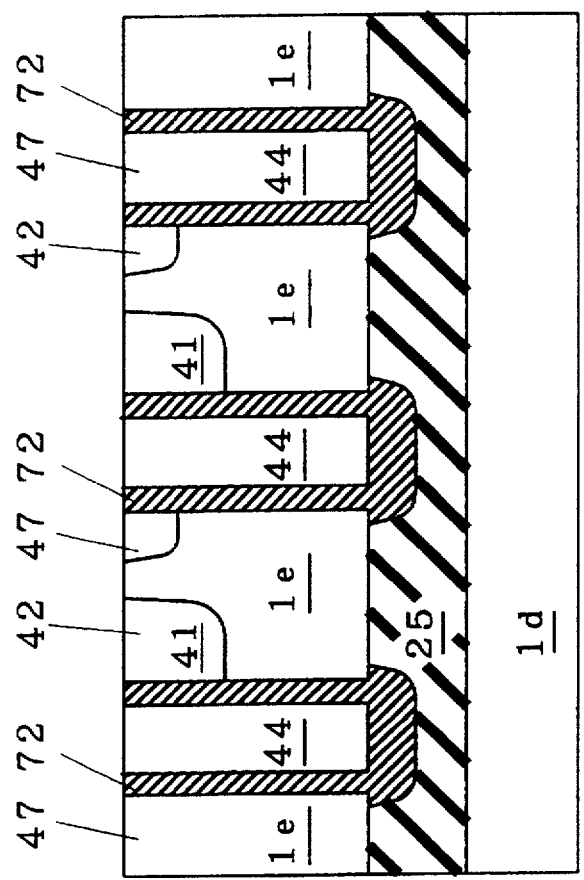
Figure 60:
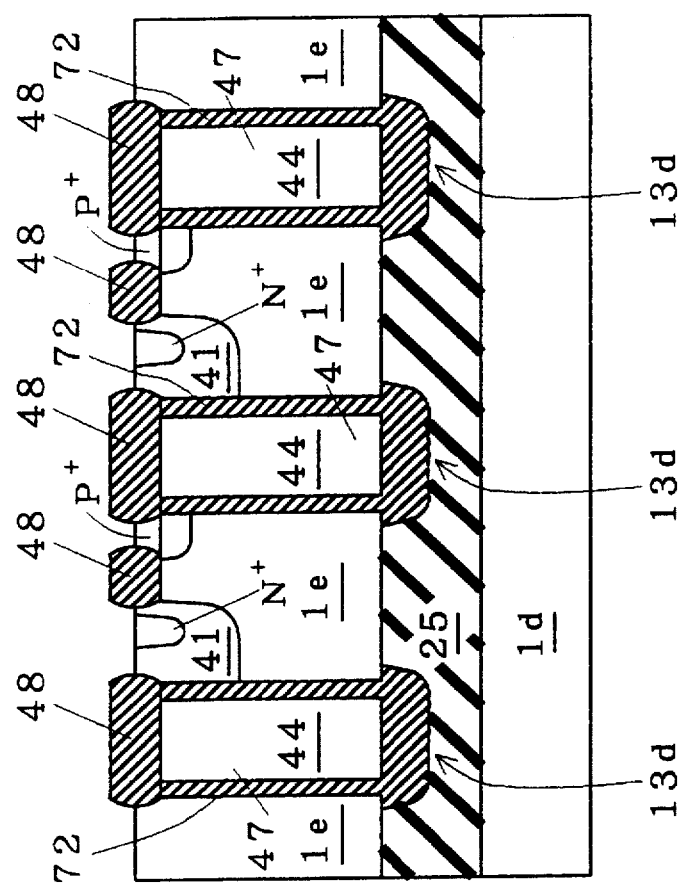
Figure 61:
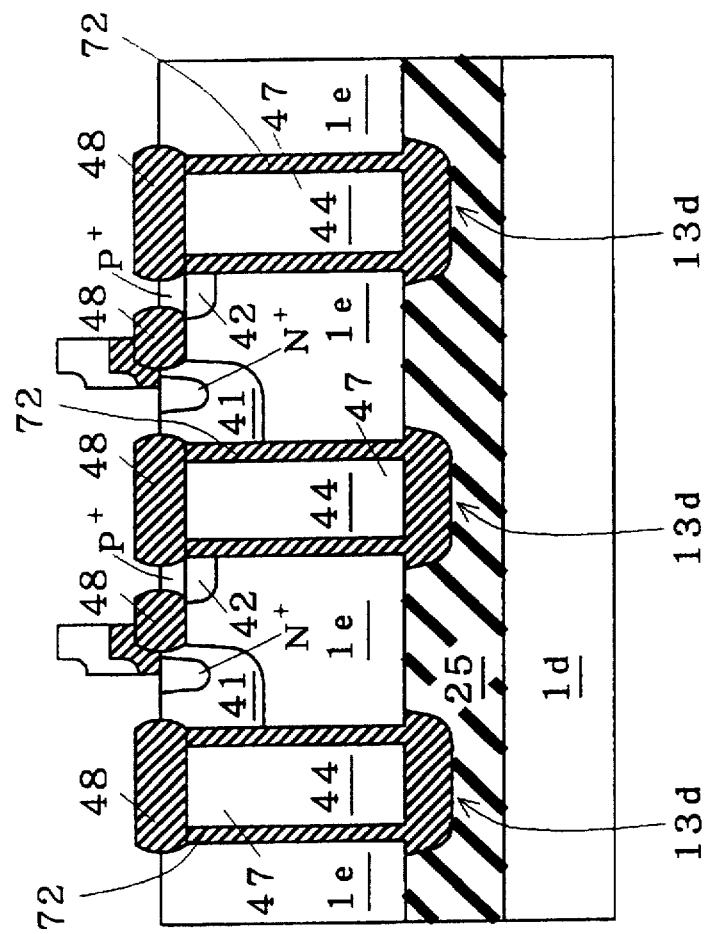

The polycrystalline silicon 47 is deposited in the same manner as the second background art and the seventh preferred embodiment to fill the trenches 44 with the polycrystalline silicon 47 (FIG. 58). The polycrystalline silicon 47 over the semiconductor substrate 1e is selectively removed so that the polycrystalline silicon 47 remains only in the trenches 44. (FIG. 59). The polycrystalline silicon 47 is covered with the field oxide films 48 (FIG. 60). A predetermined doped layer is formed, and the lateral IGBTs are formed which are isolated from each other by isolating portions 13d having a trench structure (FIG. 61).

In the isolating portions 13d formed in this manner, the problem of the decrease in isolation breakdown voltage is solved.

(e-4) Another Example of Device Isolation

The isolating portions 13b, 13c, 13d are used for isolation of the lateral IGBTs from each other in the sixth to eighth preferred embodiments. However, the sixth to eighth preferred embodiments may be applied to the isolation of different devices from each other.

Figure 62:
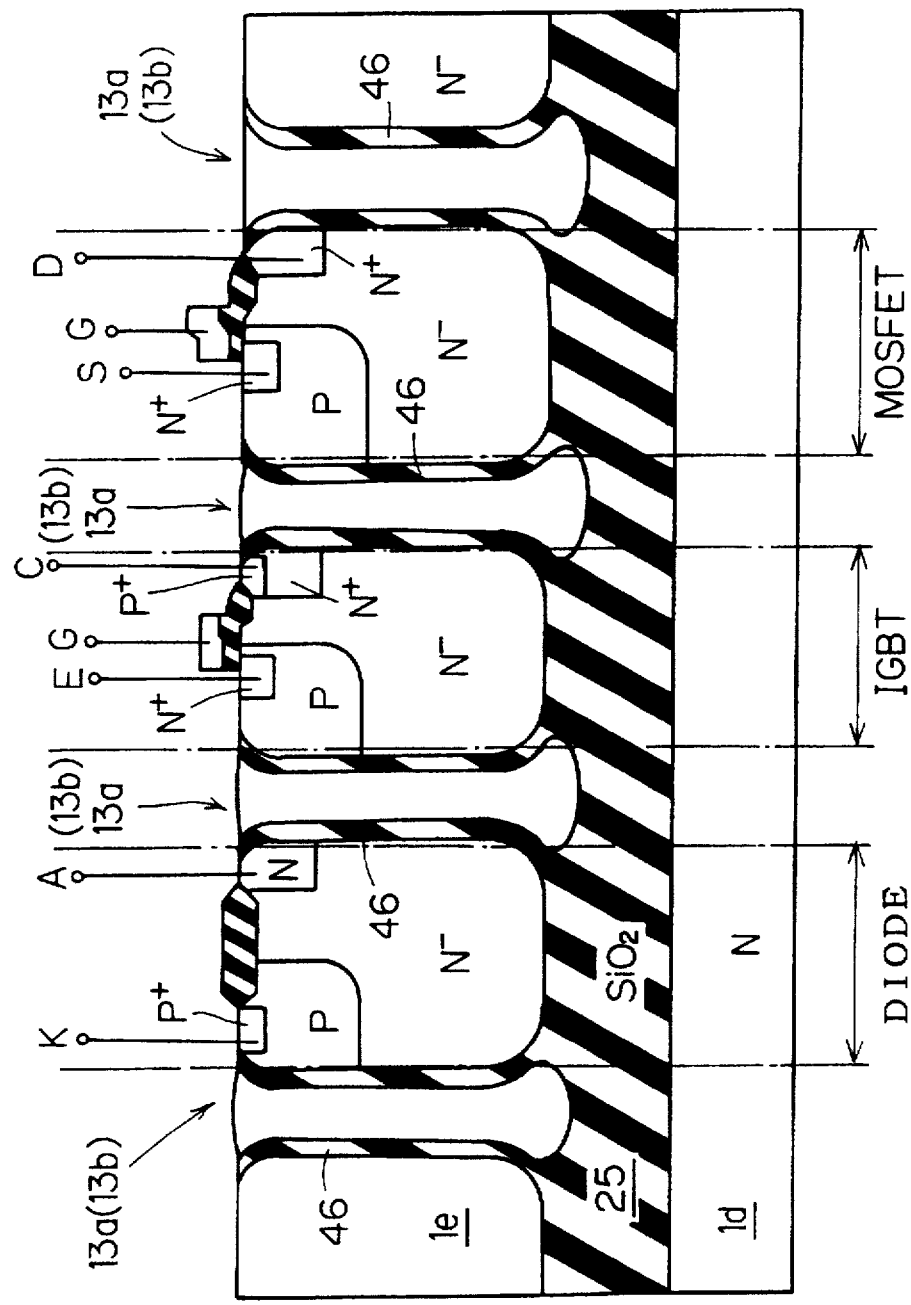
FIG. 62 is a cross-sectional view illustrating the eighth preferred embodiment.

FIG. 62 is a cross-sectional view of a lateral diode, a lateral IGBT, and an MOSFET isolated from each other, and illustrates the application of the sixth and seventh preferred embodiments. The substrate 1e is rounded in the bottoms of the isolating portions. In these portions, the silicon oxide film is not locally thin.

(e-5) Ninth Preferred Embodiment

Figure 63:
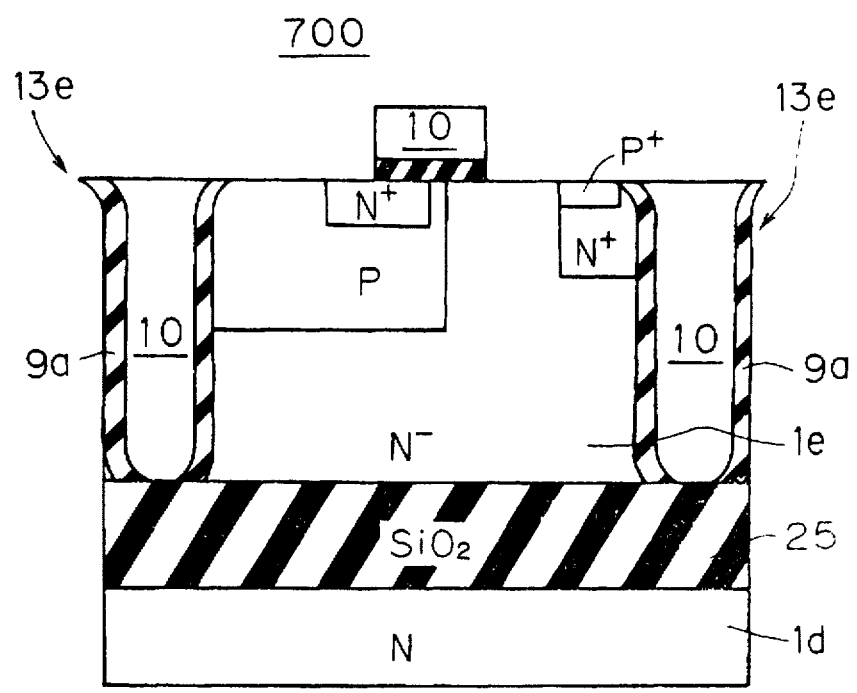
FIGS. 63 and 64 are cross-sectional views illustrating a ninth preferred embodiment according to the present invention.

Shaping of the configuration of the trench 4 provided through two oxidation processes under the conditions described in the fourth preferred embodiment may be applied to trench isolation. FIG. 63 is a cross-sectional view of a lateral IGBT 700 in a high-voltage power IC which is provided by applying the trench formation process of the fourth preferred embodiment to trench isolation.

The lateral IGBT 700 is formed in the semiconductor substrate 1e. The semiconductor substrate 1e is formed immediately over the silicon oxide film 25 formed on the semiconductor substrate 1d. Isolating portions 13e are formed by filling the polycrystalline silicon 10 after silicon oxide films 9a are formed. It should be noted that the polycrystalline silicon 10 does not function as a gate but the isolating portions 13e are used for isolation between devices.

All of the isolating portions 13e may be filled with the silicon oxide films 9a and the polycrystalline silicon 10 need not be used when the isolating portions 13e have a small width (for example, 1 μm or less) or when the isolating portions 13e are wide but a thick CVD silicon oxide film is formed for a short time (for example, several hours). Further, another film (for example, silicon nitride film) may be substituted for the polycrystalline silicon 10.

Formation of the isolating portions 13e by using the trench formation process of the fourth preferred embodiment is advantageous in that leakage is reduced in the isolating portions.

Figure 64:
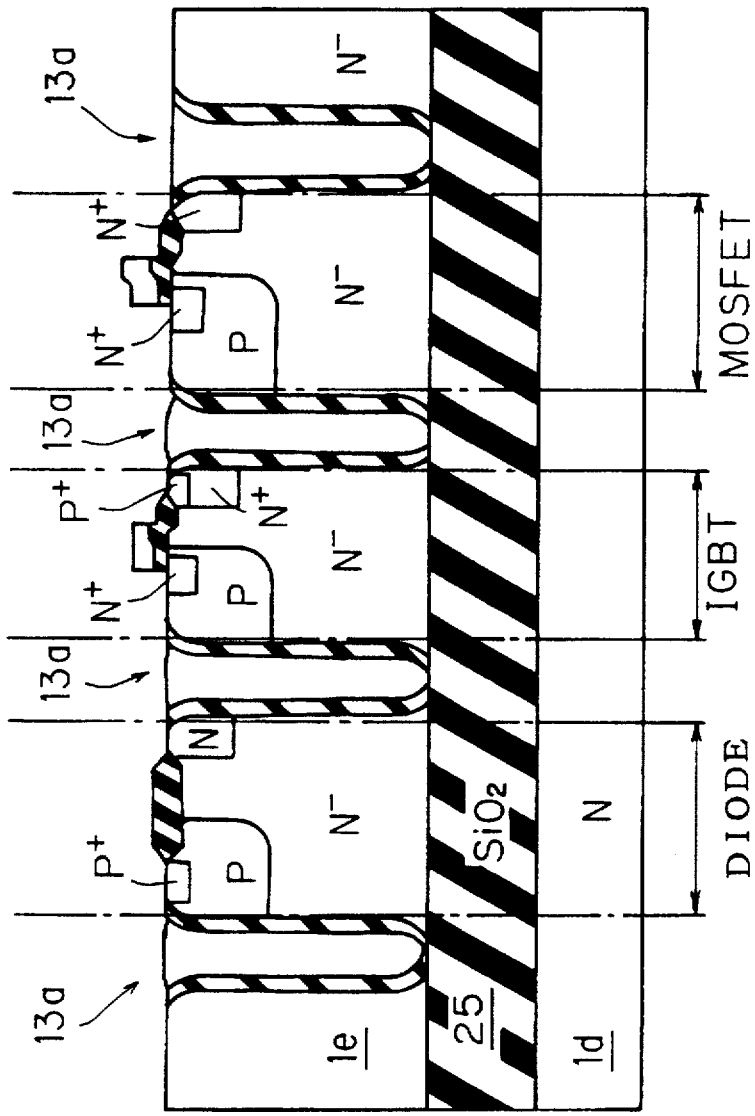

FIG. 64 is a cross-sectional view of a lateral diode, a lateral IGBT, and an MOSFET isolated from each other in the same manner as in FIG. 62, and illustrates the application of the ninth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a semiconductor device, comprising the steps of:

(a) anisotropically etching a semiconductor substrate to form a trench extending in a direction of the thickness of said substrate;

(b) performing a first thermal oxidation to form a first sacrificial oxide film in said trench;

(c) removing said first sacrificial oxide film;

(d) performing a second thermal oxidation to form a second sacrificial oxide film in said trench after said step (c);

(e) removing said second sacrificial oxide film;

(f) forming an insulating film comprising a part of a control electrode in said trench after said step (e); and (g) filling said trench to form said control electrode opposed to said substrate through said insulating film comprising said part of said control electrode.

2. The method of claim 1, wherein said second thermal oxidation is performed in a water-containing atmosphere, and said first thermal oxidation is performed at a first temperature higher than a second temperature at which said second thermal oxidation is performed.

3. The method of claim 2, wherein said first temperature is not less than 1000° C.

4. A method of fabricating a semiconductor device, comprising the steps of:

(a) anisotropically etching a semiconductor substrate to form a trench having an aspect ratio of from 2 to 30 and extending in a direction of the thickness of said substrate;

(b) performing a thermal oxidation in an atmosphere of oxygen at a temperature not less than 1000° C. to form in said trench a sacrificial oxide film having a thickness one-tenth to three-tenths the size of an opening portion of said trench;

(c) removing said sacrificial oxide film;

(d) forming an insulating film comprising a part of a control electrode in said trench after said step (c); and (e) filling said trench to form said control electrode opposed to said substrate through said insulating film comprising said part of said control electrode.

5. A method of fabricating a semiconductor device, comprising the steps of:

(a) providing a semiconductor substrate on a surface having an insulating property;

(b) anisotropically etching said semiconductor substrate to form a trench extending in a direction of the thickness of said semiconductor substrate;

(c) removing a distance of a part of said surface having an insulating property on said substrate which lies under said trench to form a recess having a diameter greater than a diameter of said trench;

(d) performing an isotropic dry etching on said semiconductor substrate to remove the recess;

(e) oxidizing an inside of said trench in an atmosphere of steam at a temperature not more than 1000° C. to form an isolation oxide film after said step (d); and (f) filling said trench with a burying material;

wherein said distance is 100 to 400 nm.

6. A method of fabricating a semiconductor device, comprising the steps of:

(a) providing a semiconductor substrate on a surface having an insulating property;

(b) anisotropically etching said semiconductor substrate to form a trench extending in a direction of the thickness of said semiconductor substrate;

(c) removing a distance of a part of said surface having an insulating property on said substrate which lies under said trench to form a recess having a diameter greater than a diameter of said trench;

(d) performing an isotropic dry etching on said semiconductor substrate to remove the recess;

(e) oxidizing an inside of said trench in an atmosphere of steam at a temperature not more than 1000° C. to form an isolation oxide film after said step (d); and (f) filling said trench with a burying material;

wherein said isotropic dry etching is performed by using an $O_2/CF_4$ based gas, and a ratio $R=O_2/CF_4$ of the gas satisfies $1<R<5$.

7. A method of fabricating a semiconductor device, comprising the steps of:

(a) anisotropically etching a semiconductor substrate made of semiconductor to form a trench extending in a direction of the thickness of said substrate;

(b) providing on said substrate a mask having an edge backing away a distance from an opening portion of said trench;

(c) performing an isotropic dry etching on said substrate by using said mask to form an oxide based film in a bottom of said trench;

(d) removing said oxide based film;

(e) oxidizing an inside of said trench in an atmosphere of steam at a temperature not more than 1000° C. after said step (d); and (f) filling said trench to form a control electrode opposed to said substrate through said insulating film comprising a part of said control electrode.

8. The method of claim 7, wherein said distance is 100 to 400 nm.

9. The method of claim 7, wherein said isotropic dry etching is performed by using an $O_2/CF_4$ based gas, and a ratio $R=O_2/CF_4$ of the gas satisfies $1<R<5$.

10. The method of claim 7, further comprising the steps of:

(g) performing a thermal oxidation to form a sacrificial oxide film in said trench; and (h) removing said sacrificial oxide film, said steps (g) and (h) being performed after said step (d) and before said step (e).

11. The method of claim 10, wherein said thermal oxidation in said step (f) is performed in an atmosphere of oxygen at a temperature ranging from 950° to 1100° C.

12. A method of fabricating a semiconductor device, comprising the steps of:

(a)(1) providing a semiconductor substrate on a surface having an insulating property;

(b) anisotropically etching said semiconductor substrate to form a trench extending in a direction of the thickness of said semiconductor substrate;

(c) performing a thermal oxidation to form a sacrificial oxide film in said trench;

(d) removing a part of said substrate which lies under said trench and said sacrificial oxide film;

(e) forming a polycrystalline semiconductor layer on an inner wall of said trench;

(f) oxidizing said polycrystalline semiconductor layer to form an isolation oxide film; and (g) filling said trench with a burying material.

13. A method of fabricating a semiconductor device, comprising the steps of:

(a)(1) providing a semiconductor substrate on a surface having an insulating property;

(b) anisotropically etching said semiconductor substrate to form a trench extending in a direction of the thickness of said semiconductor substrate;

(c) performing a thermal oxidation in an atmosphere of oxygen at a temperature not less than 1000° C. to form in said trench a sacrificial oxide film having a thickness one-tenth to three-tenths the size of an opening portion of said trench;

(d) removing said sacrificial oxide film;

(e) forming an isolation oxide film in said trench after step (c); and (f) filling said trench with a burying material.

* * * * *

UNITED STATES PATENT AND TRADEMARK OFFICE
CERTIFICATE OF CORRECTION

PATENT NO. : 5,783,491
DATED : July 21, 1998
INVENTOR(S) : Katsumi NAKAMURA et al.

It is certified that error appears in the above-identified patent and that said Letters Patent is hereby corrected as shown below:

On the Title page and at the top of column 1,
Item [54], Title is incorrect. It should be:

--METHOD OF FORMING A TRENCH MOS GATE ON A
  POWER SEMICONDUCTOR DEVICE--

Signed and Sealed this

Fifteenth Day of June, 1999

Attest:

Q. TODD DICKINSON

Attesting Officer

Acting Commissioner of Patents and Trademarks